United States Patent
Zhang et al.

(10) Patent No.: US 10,847,553 B2
(45) Date of Patent: Nov. 24, 2020

(54) METHOD OF FORMING A MULTILAYER STRUCTURE FOR A PIXELATED DISPLAY AND A MULTILAYER STRUCTURE FOR A PIXELATED DISPLAY

(71) Applicants: Massachusetts Institute of Technology, Cambridge, MA (US); Nanyang Technological University, Singapore (SG); National University of Singapore, Singapore (SG)

(72) Inventors: Li Zhang, Singapore (SG); Eng Kian Kenneth Lee, Singapore (SG); Soo Jin Chua, Singapore (SG); Eugene A. Fitzgerald, Cambridge, MA (US); Siau Ben Chiah, Singapore (SG); Joseph Sylvester Chang, Singapore (SG); Yong Qu, Singapore (SG); Wei Shu, Singapore (SG); Kwang Hong Lee, Singapore (SG); Bing Wang, Singapore (SG)

(73) Assignees: Massachusetts Institute of Technology, Cambridge, MA (US); Nanyang Technological University, Singapore (SG); National University of Singapore, Singapore (SG)

( * ) Notice: Subject to any disclaimer, the term of this patent is extended or adjusted under 35 U.S.C. 154(b) by 0 days.

(21) Appl. No.: 16/477,095

(22) PCT Filed: Jan. 12, 2018

(86) PCT No.: PCT/SG2018/050016
§ 371 (c)(1),
(2) Date: Jul. 10, 2019

(87) PCT Pub. No.: WO2018/132070
PCT Pub. Date: Jul. 19, 2018

(65) Prior Publication Data

US 2019/0355766 A1    Nov. 21, 2019

Related U.S. Application Data

(60) Provisional application No. 62/445,877, filed on Jan. 13, 2017.

(51) Int. Cl.
*H01L 27/12* (2006.01)
*H01L 21/8238* (2006.01)
(Continued)

(52) U.S. Cl.
CPC ...... *H01L 27/1262* (2013.01); *H01L 21/8238* (2013.01); *H01L 25/50* (2013.01); *H01L 27/124* (2013.01); *H01L 33/005* (2013.01)

(58) Field of Classification Search
None
See application file for complete search history.

(56) References Cited

U.S. PATENT DOCUMENTS 9,530,763 B2 * 12/2016 Fitzgerald ......... H01L 21/76251
10,049,947 B2 * 8/2018 Lee ...................... H01L 21/0217
(Continued)

FOREIGN PATENT DOCUMENTS

CN        102054666 A     5/2011

OTHER PUBLICATIONS

Lee, Kwang Hong, et al. "Integration of GaAs, GaN, and Si-CMOS on a Common 200 Mm Si Substrate through Multilayer Transfer Process." Applied Physics Express, vol. 9, No. 8, 2016, p. 086501., doi:10.7567/apex.9.086501. (Year: 2015).*

(Continued)

*Primary Examiner* — J. E. Schoenholtz
(74) *Attorney, Agent, or Firm* — Kilpatrick Townsend & Stockton LLP

(57) ABSTRACT

A method of forming a multilayer structure for a pixelated display and a multilayer structure for a pixelated display is provided. The method comprising providing a first wafer comprising first layers disposed over a first substrate, said first layers comprising non-silicon based semiconductor material for forming p-n junction LEDs (light emitting devices); providing a second partially processed wafer comprising silicon-based CMOS (Complementary Metal Oxide Semiconductor) devices formed in second layers disposed over a second substrate, said CMOS devices for controlling the LEDs; and bonding the first and second wafers to form a composite wafer via a double-bonding transfer process.

23 Claims, 16 Drawing Sheets

(51) Int. Cl.
*H01L 25/00* (2006.01)
*H01L 33/00* (2010.01)

(56) References Cited

U.S. PATENT DOCUMENTS

| | | | |
|---|---|---|---|
| 2003/0122141 | A1 | 7/2003 | Wong et al. |
| 2012/0012871 | A1 | 1/2012 | Hsia et al. |
| 2013/0207214 | A1* | 8/2013 | Haddad .............. H01L 31/0236 |
| | | | 257/432 |
| 2015/0099328 | A1* | 4/2015 | Fitzgerald ......... H01L 21/76251 |
| | | | 438/107 |
| 2016/0327737 | A1 | 11/2016 | Zhang et al. |
| 2018/0182831 | A1* | 6/2018 | Ahmed .............. H01L 27/1225 |

OTHER PUBLICATIONS

K. H. Lee et al., "Monolithic integration of III-V HEMT and Si-CMOS through TSV-less 3D wafer stacking," 2015 IEEE 65th Electronic Components and Technology Conference (ECTC), San Diego, CA, 2015, pp. 560-565. (Year: 2016).*

Lee K. H. et al., "Integration of GaAs, GaN, and SiCMOS on a common 200mm Si substrate through multilayer transfer process", Applied Physics Express, Jul. 15, 2016, vol. 9, No. 8, 6 pages, Entire document.

PCT/SG2018/050016 received an International Search Report and Written Opinion dated Apr. 13, 2018, 10 pages.

* cited by examiner

700

METHOD OF FORMING A MULTILAYER STRUCTURE FOR A PIXELATED DISPLAY AND A MULTILAYER STRUCTURE FOR A PIXELATED DISPLAY

TECHNICAL FIELD

The present disclosure relates broadly to a method of forming a multilayer structure for a pixelated display and a multilayer structure for a pixelated display.

BACKGROUND

With the explosive growth of personal mobile devices and personal computers in recent times, digital display technology has also experienced rapid development in tandem.

Of the many types of pixelated displays prevalent today, solid state implementations in the form of LCD (Liquid Crystal Displays) have become increasingly prominent. Typically, such displays utilize TFT (Thin Film transistors) to control each pixel, and a light emitting diodes as the backlight for the display. Another popular implementation is the OLED (organic LED) and TFT implementation.

However, the popular LCD-TFT and OLED-TFT implementations suffer from issues of relatively large circuit area, poor power efficiency, slower refresh rates, and low luminance.

In particular, LCD-TFT and OLED-TFT implementations require relatively sophisticated circuit designs that are dedicated to address non-uniformity issues between the LCD or OLED and the TFT, leading to larger circuit areas. Examples of these brightness non-uniformity issues may be found in e.g., US 20070008251A1 and U.S. Pat. No. 8,284,145 B2.

Additionally, the LCD-TFT and OLED TFT implementations suffer from relatively high current leakage which causes the storage capacitor of the driver circuit to discharge ineffectively, leading to power losses.

The resultant modulation bandwidth of traditional LCD-TFT and OLED-TFT implementations are also limited to only several kHz. Thus, display applications that require faster refresh rates are limited accordingly.

Therefore, there exists a need for a method of forming a multilayer structure for a pixelated display, and a multilayer structure for a pixelated display that seek to address at least one of the above problems.

SUMMARY

In accordance with a first aspect, there is provided a method of forming a multilayer structure for a pixelated display, the method comprising providing a first wafer comprising first layers disposed over a first substrate, said first layers comprising non-silicon based semiconductor material for forming p-n junction LEDs (light emitting devices); providing a second partially processed wafer comprising silicon-based CMOS (Complementary Metal Oxide Semiconductor) devices formed in second layers disposed over a second substrate, said CMOS devices for controlling the LEDs; and bonding the first and second wafers to form a composite wafer via a double-bonding transfer process.

Bonding the first and second wafers to form the composite wafer may comprises bonding a handle wafer to the second wafer, on a surface of the second wafer that is opposite the second substrate; removing the second substrate from the second wafer; and bonding the second wafer on top of the first wafer, wherein a surface of the second wafer where the second substrate has been removed, is bonded to a surface of the first wafer, opposite the first substrate.

The method may further comprise removing portions of the second layers unused by the CMOS devices, to form windows such that the first layers are exposed; and fabricating the LEDs in the first layers after the windows are formed.

Fabricating the LEDs may comprise fabricating n-contacts and p-contacts of the same height, such that the n-contacts and p-contacts are accessible at substantially the same level.

The method may further comprise forming tungsten plugs on the n-contacts and p-contacts, such that the tungsten plugs extend the n-contacts and p-contacts to be at the same level as the contacts of the CMOS devices.

The method may further comprise depositing a dielectric layer on the composite wafer on a surface opposite the first substrate; planarising the dielectric layer such that a top surface of the composite wafer is substantially level; and connecting the CMOS devices and the LEDs with multilayer metallisation processes.

Connecting the CMOS devices and the LEDs may comprise connecting the CMOS device and the LEDs with CMOS back-end-of-line multilayer metallisation processes.

Providing the first wafer may comprise providing a first partially processed wafer comprising LEDs formed in the first layers disposed over the first substrate; wherein the LEDs comprises n-contacts and p-contacts of the same height, such that the n-contacts and p-contacts are substantially at the same level.

Bonding the first and second wafers to form the composite wafer may comprise bonding a handle wafer to the second wafer, on a side of the second wafer that is opposite the second substrate; removing the second substrate from the second wafer; bonding the second wafer on top of the first wafer, wherein a side of the second wafer where the second substrate has been removed is bonded to a side of the first wafer opposite the first substrate, in a manner where the LEDs and CMOS devices do not substantially overlap each other, such that portions of the LEDs are exposed when unused portions of the second layers are removed.

The method may further comprise forming tungsten plugs on the n-contacts and p-contacts, such that the tungsten plugs extend the n-contacts and p-contacts to be at the same level as the contacts of the CMOS devices.

The method may further comprise depositing a dielectric layer on the composite wafer on a surface opposite the first substrate; planarising the dielectric layer such that a top surface of the composite wafer is substantially level; and connecting the CMOS devices and the LEDs with multilayer metallisation processes.

Connecting the CMOS devices and the LEDs may comprise connecting the CMOS device and the LEDs with CMOS back-end-of-line multilayer metallisation processes.

Bonding the first and second wafers to form the composite wafer may comprise bonding a handle wafer to the first wafer, on a side of the first wafer that is opposite the first substrate; removing the first substrate from the first wafer; and bonding the first wafer on top of the second wafer, wherein a side of the first wafer where the first substrate has been removed is bonded to a side of the second wafer opposite the second substrate.

The method may further comprise fabricating the LEDs in the first layers, in a manner where the LEDs and CMOS devices do not substantially overlap each other, such that contacts of the CMOS devices are exposed when unused portions of the first layers are removed.

Fabricating the LEDs may comprise fabricating n-contacts and p-contacts of the same height, such that the n-contacts and p-contacts are substantially at the same level.

The method may further comprise forming tungsten plugs on the contacts of the CMOS devices, such that the tungsten plugs extend the contacts of the CMOS devices to be at the same level as the n-contacts and p-contacts.

The method may further comprise depositing a dielectric layer on the composite wafer on a surface opposite the second substrate; planarising the dielectric layer such that a top surface of the composite wafer is substantially level; and connecting the CMOS devices and the LEDs with multilayer metallisation processes.

Connecting the CMOS devices and the LEDs may comprise connecting the CMOS device and the LEDs with CMOS back-end-of-line multilayer metallisation processes.

Providing the first wafer may comprise providing a first partially processed wafer comprising LEDs formed in the first layers disposed over the first substrate; and wherein the LEDs comprises n-contacts and p-contacts of the same height, such that the n-contacts and p-contacts are substantially at the same level.

Bonding the first and second wafers to form the composite wafer may comprise: bonding a handle wafer to the first wafer, on a side of the first wafer that is opposite the first substrate; removing the first substrate from the first wafer; and bonding the first wafer on top of the second wafer, wherein a side of the first wafer where the first substrate has been removed is bonded to a side of the second wafer opposite the second substrate, in a manner where the LEDs and CMOS devices do not substantially overlap each other, such that contacts of the CMOS devices are exposed when unused portions of the first layers are removed.

The method may further comprise forming tungsten plugs on the contacts of the CMOS devices, such that the tungsten plugs extend the contacts of the CMOS devices to be at the same level as the n-contacts and p-contacts.

The method may further comprise depositing a dielectric layer on the composite wafer on a surface opposite the second substrate; planarising the dielectric layer such that a top surface of the composite wafer is substantially level; and connecting the CMOS devices and the LEDs with multilayer metallisation processes.

Connecting the CMOS devices and the LEDs may comprise connecting the CMOS device and the LEDs with CMOS back-end-of-line multilayer metallisation processes.

The first layers may comprise group III-V semiconductor material, group II-VI semiconductor material or group IV semiconductor material.

In accordance with a second aspect, there is provided a multilayer structure for a pixelated display, the multilayer structure comprising first layers comprising non-silicon based semiconductor material for forming p-n junction LEDs (light emitting devices); second layers comprising silicon-based CMOS (Complementary Metal Oxide Semiconductor) devices for controlling the LEDs; wherein the first layers and second layers are obtained from respective first and second wafers, said first and second wafers bonded together to form a composite wafer via a double-bonding transfer process.

BRIEF DESCRIPTION OF THE DRAWINGS

Example embodiments of the invention will be better understood and readily apparent to one of ordinary skill in the art from the following written description, by way of example only, and in conjunction with the drawings, in which.

DETAILED DESCRIPTION

Exemplary embodiments described herein are applicable to micro-pixelated semiconductor light emitting device technology. The light emitting devices (LEDs) may comprise of arrays of individually addressable micro or nano meter-sized pixels. The light emitting devices are controlled by CMOS circuitry on the same piece of wafer as the light emitting devices. Control of the LEDs by the CMOS circuitry includes driving and addressing of the LEDs.

Example embodiments of the present disclosure also provide a method of forming a multilayer structure for a pixelated display. The method comprises a step of providing a first wafer comprising first layers disposed over a first substrate, said first layers comprising non-silicon based semiconductor material for forming p-n junction LEDs (light emitting devices). The method further comprises a step of providing a second partially processed wafer comprising silicon-based CMOS (Complementary Metal Oxide Semiconductor) devices formed in second layers disposed over a second substrate, said CMOS devices for controlling the LEDs. Further, the method further comprises a step of bonding the first and second wafers to form a composite wafer via a double-bonding transfer process.

Example embodiments of the present disclosure also provide a multilayer structure for a pixelated display, the multilayer structure comprising first layers comprising non-silicon based semiconductor material for forming p-n junction LEDs (light emitting devices); second layers comprising silicon-based CMOS (Complementary Metal Oxide Semiconductor) devices for controlling the LEDs; wherein the first layers and the second layers are obtained from respective first and second wafers, said first and second wafers bonded together to form a composite wafer via a double-bonding transfer process.

FIGS. 1A to 1D illustrate a method of forming a multilayer structure for a pixelated display, in an example embodiment. In this example embodiment, CMOS control circuitry/devices are transferred on top of the unprocessed semiconductor light emitting devices (i.e. device layers) via a double-bonding-transfer process.

In other words, the light emitting devices are fabricated only after the first wafer is bonded with the second wafer. Prior to bonding with the second wafer, the first wafer comprises layers suitable for forming semiconductor light emitting devices in the form of e.g., diodes or laser diodes which are grown on Si (or other substrates). As for bonding, the first wafer is vertically integrated to CMOS control circuitry on a Si wafer via a double-bonding-transfer process. After bonding, windows are opened on the second wafer comprising the CMOS control circuitry/devices, in order for the layers suitable for forming the semiconductor light emitting devices to be exposed and accessible, such that the light emitting devices can be fabricated.

Figure 1A:
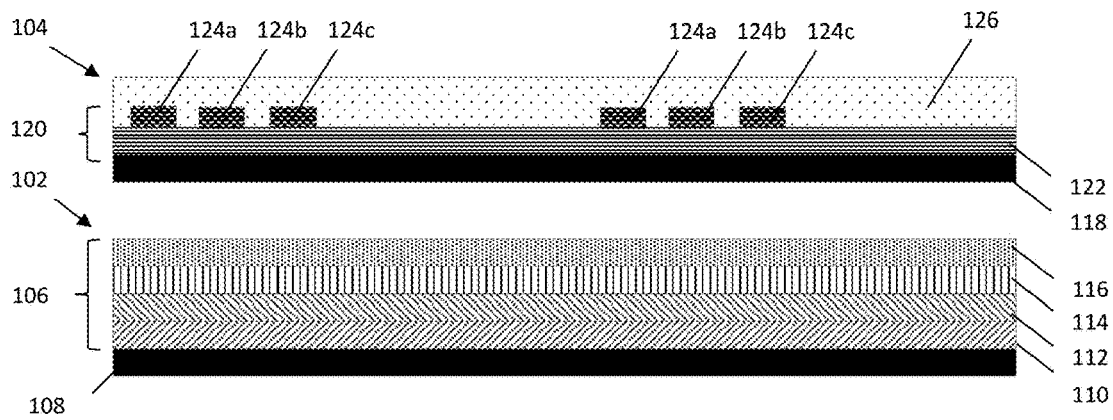
FIGS. 1A to 1D illustrate a method of forming a multilayer structure for a pixelated display, in an example embodiment.

FIG. 1A shows a first wafer 102 and a second wafer 104, in an example embodiment. The first wafer 102 comprises unprocessed layers 106 for forming light emitting devices disposed over a first substrate 108. The layers 106 comprises a buffer layer 110 disposed over the substrate layer 108, an n-type semiconductor layer 112 disposed over the buffer layer 110, an active region layer 114 disposed over the n-type semiconductor layer 112, and a p-type semiconductor layer 116 disposed over the active region layer 114. It will be appreciated that a dielectric oxide layer (not shown) is disposed over the p-type semiconductor 116 layer.

The second wafer 104 is a partially processed wafer where CMOS (Complementary Metal Oxide Semiconductor) devices have been formed in second layers 120 disposed over a second substrate 118. The second layers comprises the CMOS device layer 122 as well as the source, gate and drain contacts 124a, 124b and 124c of each transistor of the CMOS device. The second wafer 104 further comprise a dielectric layer 126 formed over the respective top layers of the second wafer 104. For the second wafer 104, the dielectric layer 126 encapsulates contacts 124a, 124b and 124c. The dielectric layers may comprise SiO$_2$, with the possible inclusion of SiNx.

The first wafer 102 and the second wafer 104 are bonded together via a double-bonding transfer process.

In the example embodiment, the first wafer 102 comprises (and arranged in the following top-down orientation): a layer of dielectric material (not shown), first layers 106 for forming LEDs (which is different from silicon), and a substrate layer of e.g., silicon material 108. The layer of dielectric material of the first wafer 102, is deposited on the first layers 106 using Plasma-Enhanced Chemical Vapour Deposition (PECVD). For simplicity sake, the layer of dielectric material is hereinafter referred to as the PECVD SiO2 layer.

It will be appreciated that while the example embodiments define the deposition of the dielectric layer by means of PECVD, alternative deposition techniques may be implemented. For example, in alternative embodiments, PETEOS (Plasma-enhanced deposition of oxides from TEOS), HDP (High Density Plasma) CVD or the like-methods may be implemented.

In the example embodiment, the first layers 106 comprises group III-V semiconductor material, which may include (for example): GaN, InGaP, AlGaAs, InGaAsP, InGaN, AlGaN, GaAs, InGaAs, or any suitable combinations thereof, or the like. Thus, the first wafer 102 may also be termed as a III-V/Si (e.g. InGaAs/GaAs/Si or GaN/Si) wafer. Both the InGaAs/GaAs/Ge/Si and GaN/Si wafers may be grown epitaxially using Metalorganic Chemical Vapour Deposition (MOCVD) or Molecular Beam Epitaxy (MBE).

It will be appreciated that after the PECVD process, the surface roughness may be relatively high and thus, Chemical Mechanical Planarization (CMP) may be further required after the PECVD process to achieve the desired surface roughness of e.g., less than 1 nm, to facilitate fusion bonding. In this regard, the PECVD SiO2 layer deposited on the first layers 106 may serve as a capping layer for planarization process, as well as providing a bonding interface subsequently. Additional densification is carried out (at a suitable temperature between 300° C. to 850° C.) to eliminate any residual gas molecules and by-products incorporated into the PECVD SiO2 layer during the oxide deposition. In this case, the densification process is done at 450° C. for several hours in a nitrogen environment. After densification, the PECVD SiO2 layer is planarized using CMP process.

It will be appreciated that the first layers 106 may comprise other semiconductor material groups such as group II-VI and group IV semiconductor materials which may include e.g., BAlN, BGaN, BInN, BInGaN, AlN, ZnO or MgZnO.

Under this double-bonding transfer process, a handle wafer (not shown) is first bonded to the second wafer 104 (e.g. using a wafer bonder) to enable removal of the layer of the second substrate 118. Specifically, the handle wafer is bonded to a surface of the second wafer 104 that is opposite the second substrate 118. The handle substrate may be formed of silicon, but does not preclude other suitable materials from being used. The second wafer 104 (now bonded with the handle wafer) may be annealed to increase and enhance the bonding strength between the handle wafer and the CMOS device layers 120.

Next, the second substrate 118 is removed from the second wafer 104. Particularly, the second substrate 118 is at least partially removed using mechanical grinding, and then followed by depositing (e.g. spin coating) a layer of protective material (e.g. ProTEK®B3-25, silicon dioxide or silicon nitride). Subsequently, the second wafer (bonded with the handle wafer) is wet- or dry-etched to substantially remove any remaining portions of the second substrate 118 (that are not removed by the mechanical grinding). It is to be appreciated that a dielectric oxide layer (not shown) may be provided between the second substrate 118 and CMOS device layer 122 to serve as an etch-stop layer during the wet-etching process. With removal of the layer of second substrate 118, the second wafer is considered as being temporarily transferred to the handle wafer. After etching, the protective material is removed from the handle wafer using oxygen plasma. Alternatively, the coating of protective material is removable using an appropriate solvent, such as acetone, methyl isoamyl ketone (MIAK) or methyl ethyl ketone (MEK).

Subsequently, the second wafer is ready to be bonded to the first wafer. To prepare for this second bonding step, the second wafer 104 and the first wafer 102 are first positioned relative to each other such that the surface of the first wafer opposite the first substrate 108 (e.g., oxide layer over the p-type layer 116), face the surface of the second wafer, where the second substrate 118 has been removed (e.g., oxide layer under the CMOS device layer 122).

In this embodiment, for illustration purpose, the second wafer 104 is positioned above the first wafer 102, and so, it will be appreciated that the first and second wafers 102, 104 are arranged diametrically to each other in this position. To generalise, all that is required for the bonding is to bring the layer 116 of the first wafer 102 and CMOS device layer 122 of the second wafer 104 together, such that their covering oxide layers are in contact and then bonding them (e.g.

using, fusion bonding or thermal compression bonding, which can be further strengthened optionally with annealing).

Without loss of generality, a combined wafer 130 is formed from this bonding of the first and second wafers 102, 104. The bonding may be viewed as bonding the second wafer 104 on top of the first wafer 102, wherein a surface of the second wafer 104 where the second substrate 118 has been removed, is bonded to a surface of the first wafer 102, opposite the first substrate 108. In this bonding process, the respective bonded surfaces of the first wafer 102 and the second wafer 104 contain oxide layers (not shown in FIG. 1A), which serves as a bonding medium/agent 128 as now shown in FIG. 1B.

Next, the handle wafer is removed from the combined wafer 130 to expose at least a portion (e.g. an entire surface) of the CMOS device layer 122, which may be further processed for intended applications. In particular, the handle wafer is removed using mechanical grinding and then wet etched to substantially remove any remaining portions of the handle wafer, not removable by the mechanical grinding.

Figure 1B:
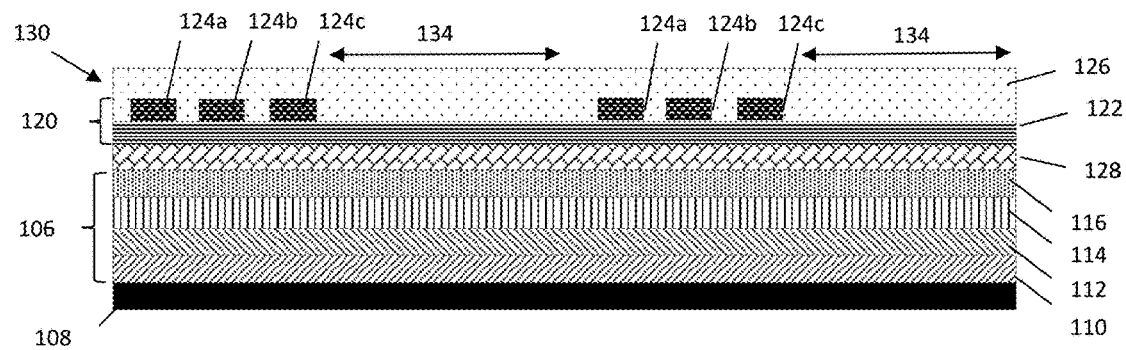

FIG. 1B shows the combined wafer 130, comprising the bonded first wafer and second wafer, where the second substrate 118 has been removed, in the example embodiment. The bonding medium agent 128 rests between the interface of the bond between the first and second wafers, between the CMOS device layers 120 and the first unprocessed LED layers 106.

Detailed information on the techniques of the double-bonding transfer process have been described in U.S. Pat. No. 9,530,763B2, and PCT Publication No. WO 2016/007088, and which are hereby incorporated by reference in their entirety.

Figure 1C:
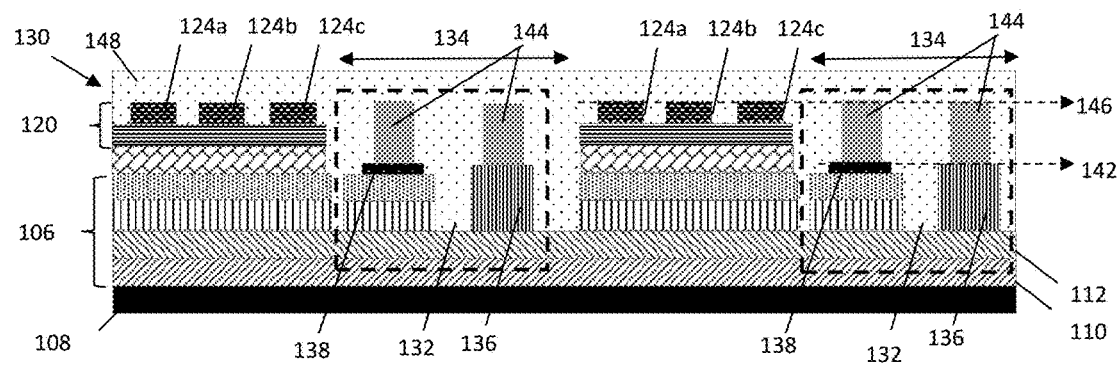

After the combined wafer has been formed, the fabrication of the light emitting devices within the first layers 106 of the first wafer can commence. FIG. 1C shows the combined wafer 130, comprising the bonded first wafer and second wafer, where fabrication of the light emitting devices 132 has been completed, in the example embodiment.

An exemplary method of fabrication of the light emitting devices is as follows.

Firstly, windows 134 are opened on the second layers 120 of the CMOS wafer such that the first layers for forming the LEDs 132 are exposed and accessible from above the composite wafer. It will be appreciated that the windows 134 allow portions of the second layers which are unused by the CMOS devices, as well as the intervening sections of the bonding medium 128, to be removed. This may be achieved using typical lithography and etching techniques, which are known to a skilled person and are thus not described in detail herein for brevity.

Once the first layers are exposed and accessible, the LEDs may be formed using a combination of lithography techniques such as mesa etching, n-contact formation, p-contact formation $SiO_2$ deposition and planarization steps, which are known to a skilled person and are thus not described in detail herein for brevity. The n-contacts 136 and p-contacts 138 of the LEDs 132 are fabricated respectively, wherein the surface of both n-contacts 136 and p-contacts 138 are of approximately the same height, such that the n-contacts 136 and p-contacts 138 are accessible from above the composite wafer 130, at substantially the same level 142 relative to the substrate 108.

Thereafter, tungsten plugs 144 are deposited onto the n-contacts 136 and p-contacts 138 such that they are extended to be accessible from above the composite wafer 130, at substantially the same level 146 as the contacts 124a, 124b and 124c of the CMOS device, relative to the substrate 108. The combined or integrated wafer 130 is then deposited with a dielectric 148, e.g., $SiO_2$ and planarized.

It will be appreciated that it is possible to immediately perform the tungsten deposition and subsequently etch away the unwanted portions of tungsten that is not above contacts 136 and 138. However, process yield related issues and limits to the types of geometric structures that be formed with the tungsten deposition may result.

Figure 1D:
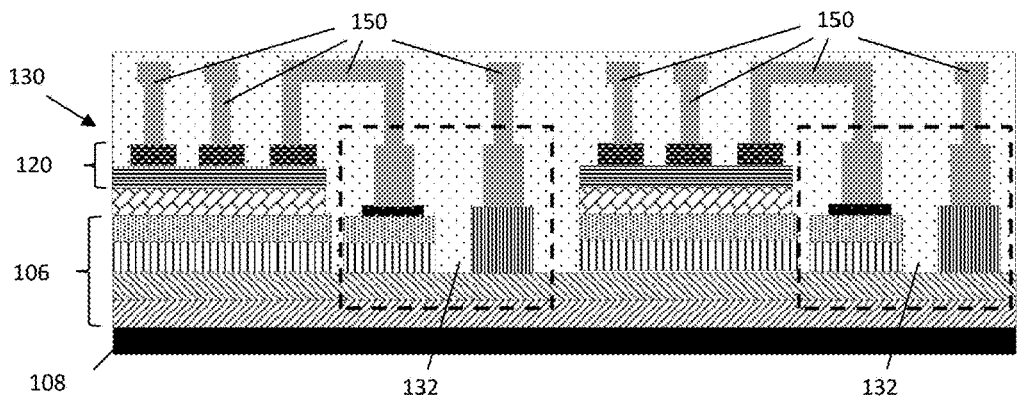

Thus, in the example embodiment, prior to the tungsten plug formation/deposition described above, a new dielectric layer (e.g., PECVD $SiO_2$ layer) is deposited over the entire wafer 130 and planarized. Thereafter, new windows are opened in the PECVD SiO2 over the n-contacts 136 and p-contacts 138 into which tungsten plugs 144 are deposited. As the deposition is a blanket process (i.e. over the entire wafer 130), the deposition may be followed by an etching and/or chemical mechanical polishing (CMP) step where the purpose is to polish or mechanically grind away/remove material (rather than planarize) such that excess tungsten that is outside the abovementioned windows (in which tungsten plugs 144 are formed) is removed. It will further be appreciated that while FIGS. 1C and 1D show substantially rectangular tungsten plug/pad 144, the tungsten plug/pad 144 in the example embodiment may comprise optimized structures in the form of e.g., combs (i.e. "teeth" which extend downwards into contacts 136 and 138). These optimised complex structures can only be formed with the additional $SiO_2$ deposition and planarization and window opening steps mentioned above.

Figure 5:
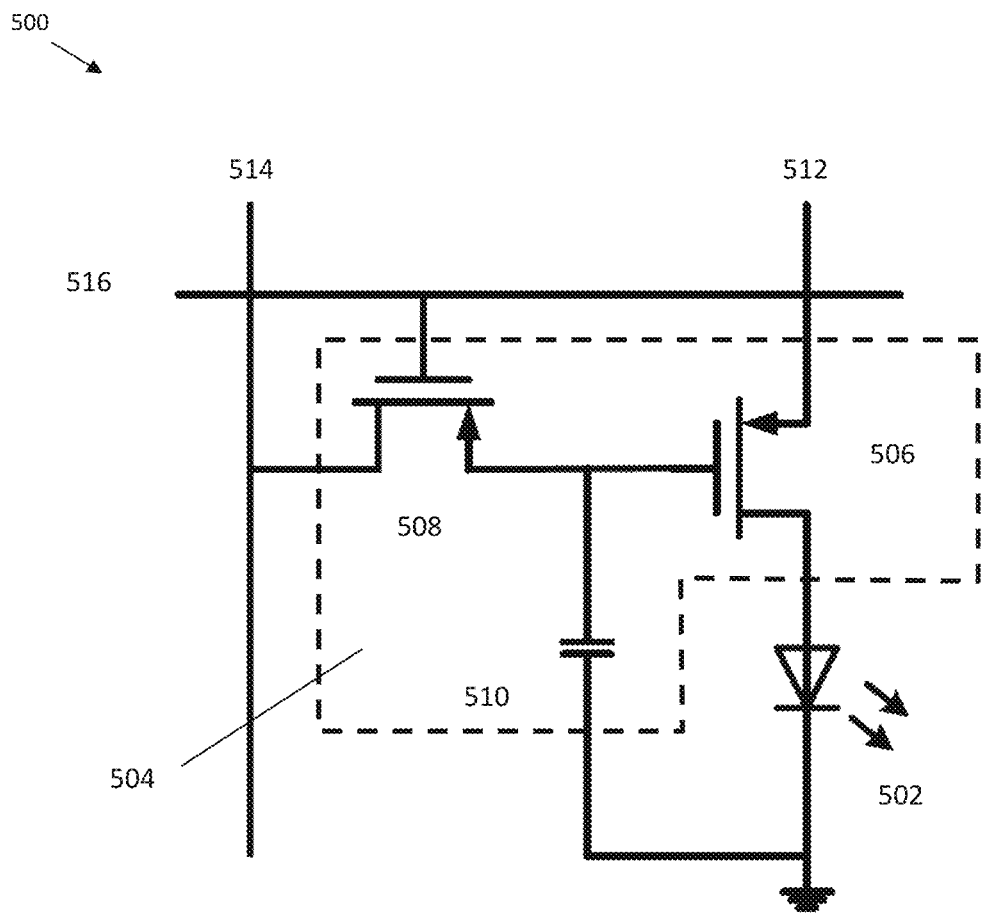
FIG. 5 is a schematic diagram of a unit cell comprising a single LED and a driver unit, in an example embodiment.

Finally, multilayer metallization processes, which may include, but not limited to, standard or existing CMOS back-end-of-line (BEOL) processes, are used to electrically connect the CMOS devices and light emitting devices to form the desired circuitry, a schematic example of which is shown in FIG. 5. For example, the BEOL process may further include the steps of:

1. Making holes in the pre-metal dielectric layer (e.g., dielectric layer 148) and extending the contacts of the CMOS device (e.g., 124a, 124b, 124c) and LED (e.g., previously already extended by the tungsten plug 144);
2. Adding a first metal layer;
3. Adding an intra-metal dielectric layer;
4. Making further vias through the intra-metal dielectric to connect the first metal layer metal with the subsequent higher metal layer, with the vias filled by metal CVD processes.

It will be appreciated that where applicable or required, further metal layers may be added by repeating steps 2 to 4.

FIG. 1D shows the combined wafer 130, comprising the bonded first wafer and second wafer, where fabrication of the light emitting devices 132 has been completed, and metal (e.g., tungsten) interconnects 150 between the CMOS devices and light emitting devices have been formed, in the example embodiment. A final passivation layer may be added to protect the chip.

It will be appreciated that while the example embodiment shown in FIG. 1 shows a "p-up" device structure where the p-type semiconductor layer 116 is disposed above the n-type semiconductor layer 112, the orientation of the layers 112 and 116 may be reversed while still allowing the formation of light emitting devices. In other words, in an alternative embodiment, the layer 116 may be a n-type semiconductor layer, and the layer 112 may be a p-type semiconductor layer to form a "p-down" device structure. In this alternative embodiment, the contact 136 becomes the p-contact, while the contact 138 becomes the n-contact. It will be appreciated that both "p-up" and "p-down" structures are known/typical orientations for p-n junction devices.

FIGS. 2A to 2D illustrate a method of forming a multi-layer structure for a pixelated display, in another example embodiment. In this example embodiment, CMOS control circuitry/devices are transferred on top of the processed semiconductor light emitting devices (i.e. device layers) via an aligned double-bonding-transfer process.

In other words, the light emitting devices have been fabricated prior to bonding with the second wafer. The first wafer comprises fabricated light emitting devices in the form of e.g., diodes or laser diodes which are grown on Si (or other substrates). As for bonding, because the light emitting devices have been fabricated, the bonding of the first and second wafers is aligned to ensure that the vertically integrated CMOS control circuitry do not substantially overlap the fabricated LEDs, such that portions of the LEDs are accessible from above the second wafer, in order for metal interconnects (in the form of e.g., tungsten vias made through etching of the CMOS layers and the bonding medium) between the LEDs and CMOS devices to be formed.

Figure 2A:
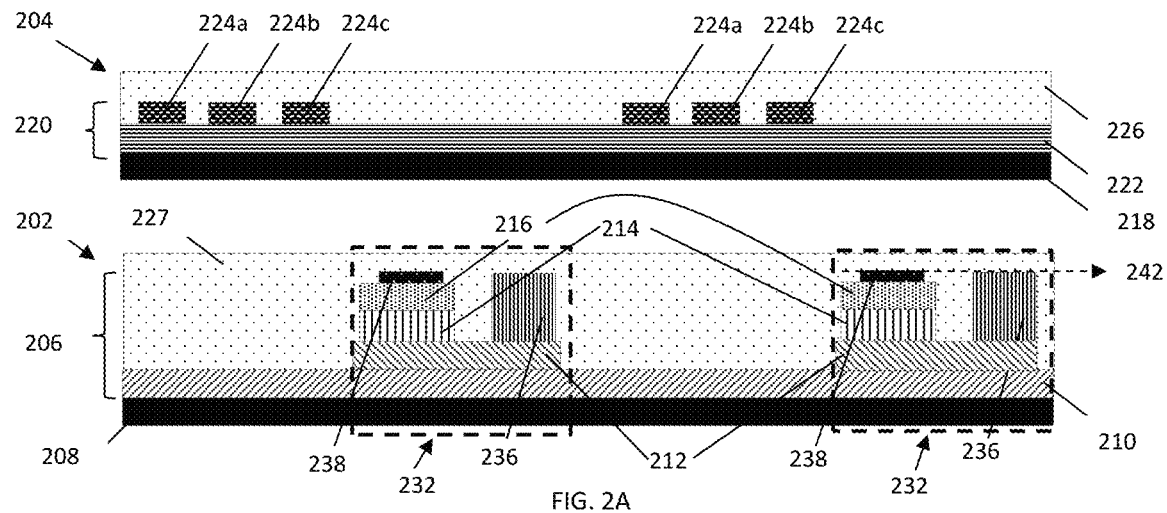
FIGS. 2A to 2D illustrate a method of forming a multilayer structure for a pixelated display, in another example embodiment.

FIG. 2A shows a first wafer 202 and a second wafer 204, in an example embodiment. The first wafer 202 comprises partially processed layers 206 where light emitting devices 232 have been pre-fabricated and are disposed over a first substrate 208.

Prior to fabrication of the LEDs 232, the first wafer 202 is similar to the wafer 102 as illustrated in FIG. 1A. That is, the layers 206 originally comprises a buffer layer 210 disposed over the substrate layer 208, an n-type semiconductor layer 212 disposed over the buffer layer 210, an active region layer 214 disposed over the n-type semiconductor layer 212, and a p-type semiconductor layer 216 disposed over the active region layer 214.

During fabrication, the LEDs 232 are formed using a combination of lithography techniques such as mesa etching, n-contact formation, p-contact formation $SiO_2$ deposition and planarization steps, which are known to a skilled person and are thus not described in detail herein for brevity. Preferably, the n-contacts 236 and p-contacts 238 of the LEDs 232 are fabricated respectively, wherein the surface of both n-contacts 236 and p-contacts 238 are of approximately the same height, such that the n-contacts 236 and p-contacts 238 are accessible from above first wafer 202 at substantially the same level 242, relative to the substrate 208. It will be appreciated that a dielectric oxide layer is disposed over the first wafer 202 to complete the fabrication of the LEDs 232 on the first wafer 202.

In the example embodiment, the layer of dielectric material of the first wafer 202, is deposited on the first layers 206 using Plasma-Enhanced Chemical Vapour Deposition (PECVD). For simplicity sake, the layer of dielectric material is hereinafter referred to as the PECVD $SiO_2$ layer.

In the example embodiment, the first layers 206 comprises group III-V semiconductor material, which may include (for example): GaN, InGaP, AlGaAs, InGaAsP, InGaN, AlGaN, GaAs, InGaAs, or any suitable combinations thereof, or the like. Thus, the first wafer 202 may also be termed as a III-V/Si (e.g. InGaAs/GaAs/Si or GaN/Si) wafer. Both the InGaAs/GaAs/Ge/Si and GaN/Si wafers may be grown epitaxially using Metalorganic Chemical Vapour Deposition (MOCVD) or Molecular Beam Epitaxy (MBE).

It will be appreciated that after the PECVD process the surface roughness may be relatively high and thus, Chemical Mechanical Planarization (CMP) may be further required after the PECVD process to achieve the desired surface roughness of e.g., less than 1 nm, to facilitate fusion bonding. In this regard, the PECVD $SiO_2$ layer deposited on the first layers 206 may serve as a capping layer for planarization process, as well as providing a bonding interface subsequently. Additional densification is carried out (at a suitable temperature between 300° C. to 850° C.) to eliminate any residual gas molecules and by-products incorporated into the PECVD $SiO_2$ layer during the oxide deposition. In this case, the densification process is done at 450° C. for several hours in a nitrogen environment. After densification, the PECVD $SiO_2$ layer is planarized using CMP process.

It will be appreciated that the first layers 206 may comprise other semiconductor material groups such as group II-VI and group IV semiconductor material, which may include, e.g., BAlN, BGaN, BInN, BInGaN, AlN, ZnO or MgZnO.

The second wafer 204 is a partially processed wafer where CMOS (Complementary Metal Oxide Semiconductor) devices have been formed in second layers 220 disposed over a second substrate 218. The second layers comprise the CMOS device layer 222 as well as the source, gate and drain contacts 224a, 224b and 224c of each transistor of the CMOS device. The first and second wafers 202, 204 further comprise respective dielectric layers 227, 226 formed over the respective top layers of the first and second wafers 202, 204. For the second wafer 204, the dielectric layer 226 encapsulates contacts 224a, 224b and 224c. The dielectric layers may comprise $SiO_2$, with the possible inclusion of $SiN_x$.

The first wafer 202 and the second wafer 204 are bonded together via a double-bonding transfer process. Under this double-bonding transfer process, a handle wafer (not shown) is first bonded to the second wafer 204 (e.g. using a wafer bonder) to enable removal of the layer of the second substrate 218. Specifically, the handle wafer is bonded to a surface of the second wafer 204 that is opposite the second substrate 218. The handle substrate may be formed of silicon, but does not preclude other suitable materials from being used. The second wafer 204 (now bonded with the handle wafer) may be annealed to increase and enhance the bonding strength between the handle wafer and the CMOS device layers 220.

Next, the second substrate 218 is removed from the second wafer 204. Particularly, the second substrate 218 is at least partially removed using mechanical grinding, and then followed by depositing (e.g. spin coating) a layer of protective material (e.g. ProTEK®B3-25, silicon dioxide or silicon nitride). Subsequently, the second wafer (bonded with the handle wafer) is wet- or dry-etched to substantially remove any remaining portions of the second substrate 218 (that are not removed by the mechanical grinding). It is to be appreciated that a dielectric oxide layer (not shown) may be provided between the second substrate 218 and CMOS device layer 222 to serve as an etch-stop layer during the wet-etching process. With removal of the layer of second substrate 218, the second wafer is considered as being temporarily transferred to the handle wafer. After etching, the protective material is removed from the handle wafer using oxygen plasma. Alternatively, the coating of protective material is removable using an appropriate solvent, such as acetone, methyl isoamyl ketone (MIAK) or methyl ethyl ketone (MEK).

Subsequently, the second wafer is ready to be bonded to the first wafer. To prepare for this second bonding step, the second wafer 204 and the first wafer 202 are first positioned relative to each other such that the surface of the first wafer opposite the first substrate 208 (e.g., oxide layer over the p-type layer 216), face the surface of the second wafer, where the second substrate 218 has been removed (e.g., oxide layer under the CMOS device layer 222).

In this embodiment, for illustration purpose, the second wafer 204 is positioned above the first wafer 202, and so, it will be appreciated that the first and second wafers 202, 204 are arranged diametrically to each other in this position. To generalise, all that is required for the bonding is to bring the layer 216 of the first wafer 202 and CMOS device layer 222 of the second wafer 204 together, such that their covering oxide layers are in contact and then bonding them (e.g. using, fusion bonding or thermal compression bonding, which can be further strengthened optionally with annealing).

Without loss of generality, a combined wafer 230 is formed from this bonding of the first and second wafers 202, 204. The bonding may be viewed as bonding the second wafer 204 on top of the first wafer 202, wherein a surface of the second wafer 204 where the second substrate 218 has been removed, is bonded to a surface of the first wafer 202, opposite the first substrate 208. In this bonding process, the respective bonded surfaces of the first wafer 202 and the second wafer 204 contain oxide layers, which serves as a bonding medium/agent 228 as now shown in FIG. 2B.

In this example embodiment, the LEDs 232 and CMOS devices have been fabricated prior to the bonding process. Thus, an alignment of the LEDs 232 and CMOS devices will have to be performed, during the bonding process. That is, the second wafer 204 is bonded on top of the first wafer 202, wherein a side of the second wafer where the second substrate 218 has been removed is bonded to a side of the first wafer opposite the first substrate, in a manner where the LEDs 232 and CMOS devices do not substantially overlap each other, such that portions of the LEDs 232 can be exposed and are accessible from above the composite wafer 230 when unused portions 240 of the second layers 220 (unused by the CMOS devices) are removed.

Next, the handle wafer is removed from the combined wafer 230 to expose at least a portion (e.g. an entire surface) of the CMOS device layer 222, which may be further processed for intended applications. In particular, the handle wafer is removed using mechanical grinding and then wet etched to substantially remove any remaining portions of the handle wafer, not removable by the mechanical grinding.

Figure 2B:
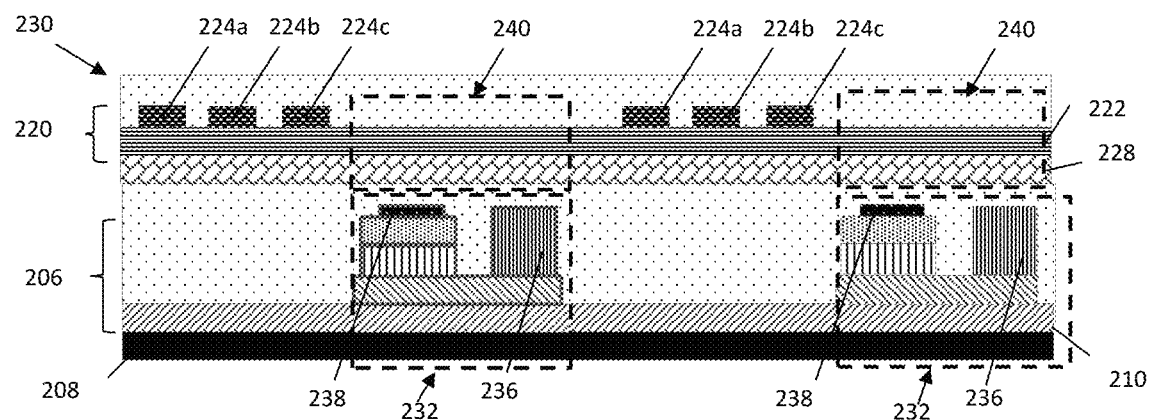

FIG. 2B shows the combined wafer 230, comprising the bonded first wafer and second wafer, where the second substrate 218 has been removed, in the example embodiment. The bonding medium agent 228 rests between the interface of the bond between the first and second wafers, between the CMOS device layers 220 and the first unprocessed LED layers 206.

Detailed information on the techniques of the double-bonding transfer process have been described in U.S. Pat. No. 9,530,763B2, and PCT Publication No. WO 2016/007088, and which are hereby incorporated by reference in their entirety.

Thereafter, using lithography and etching techniques, the unused portions 240 of the second layers 220 can be removed, and tungsten plugs 244 are deposited onto the n-contacts 236 and p-contacts 238 such that they are extended to be accessible from above the composite wafer 230, at substantially the same level 246 as the contacts 224a, 224b and 224c of the CMOS device, said level relative to the substrate 208.

It will be appreciated that it is possible to immediately perform the tungsten deposition and subsequently etch away the unwanted portions of tungsten that is not above contacts 236 and 238. However, process yield related issues and limits to the types of geometric structures that be formed with the tungsten deposition may result.

Figure 2C:
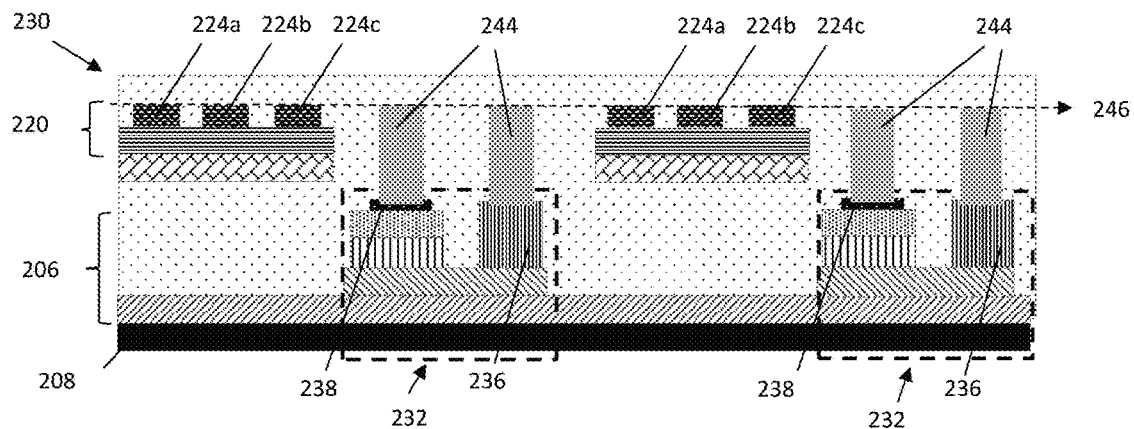
Figure 2D:
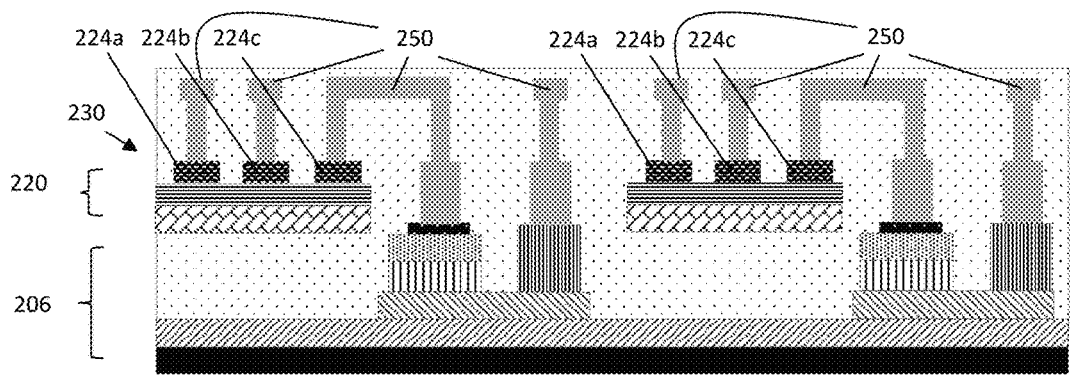

Thus, in the example embodiment, prior to the tungsten plug formation/deposition described above, a new dielectric layer (e.g., PECVD $SiO_2$ layer) is deposited over the entire wafer 230 and planarized. Thereafter, new windows are opened in the PECVD SiO2 over the n-contacts 236 and p-contacts 238 into which tungsten plugs 244 are deposited. As the deposition is a blanket process (i.e. over the entire wafer 230), the deposition may be followed by an etching and/or chemical mechanical polishing (CMP) step where the purpose is to polish or mechanically grind away/remove material (rather than planarize) such that excess tungsten that is outside the abovementioned windows (in which tungsten plugs 244 are formed) is removed. It will further be appreciated that while FIGS. 2C and 2D show substantially rectangular tungsten plugs/pads 244, the actual optimized structures comprise combs (i.e. "teeth" which extend downwards into contacts 136 and 138). These optimised complex structures can only be formed with the additional $SiO_2$ deposition and planarization and window opening steps mentioned above.

The combined or integrated wafer 230 is then deposited with a dielectric 248, e.g., $SiO_2$ and planarized. FIG. 2C shows the combined wafer 230 comprising the first wafer and second wafer with their respectively fabricated LEDs 232 and CMOS devices, with the tungsten plugs 244, in the example embodiment.

Finally, multilayer metallization processes, which may include, but not limited to, standard or existing CMOS back-end-of-line (BEOL) processes, are used to electrically connect the CMOS devices and light emitting devices to form the desired circuitry, a schematic example of which is shown in FIG. 5. For example, the BEOL process may further include the steps of:

1. Making holes in the pre-metal dielectric layer (e.g., dielectric layer 248) and extending the contacts of the CMOS device (e.g., 224a, 224b, 224c) and LED (e.g., previously already extended by the tungsten plug 244);
2. Adding a first metal layer;
3. Adding an intra-metal dielectric layer;
4. Making further vias through the intra-metal dielectric to connect the first metal layer metal with the subsequent higher metal layer, with the vias filled by metal CVD processes.

It will be appreciated that where applicable or required, further metal layers may be added by repeating steps 2 to 4.

FIG. 2D shows the combined wafer 230, comprising the bonded first wafer and second wafer, wherein metal (e.g., tungsten) interconnects 250 between the CMOS devices and light emitting devices have been formed, in the example embodiment.

It will be appreciated that while the example embodiment shown in FIG. 2 shows a "p-up" device structure where the p-type semiconductor layer 216 is disposed above the n-type semiconductor layer 212, the orientation of the layers 212 and 216 may be reversed while still allowing the formation of light emitting devices. In other words, in an alternative embodiment, the layer 216 may be a n-type semiconductor layer, and the layer 212 may be a p-type semiconductor layer to form a "p-down" device structure. In this alternative embodiment, the contact 236 becomes the p-contact, while the contact 238 becomes the n-contact. It will be appreciated that both "p-up" and "p-down" structures are known/typical orientations for p-n junction devices.

It will be appreciated that the double-bonding transfer process as disclosed above in FIG. 1A to 1D and FIG. 2A to 2B are purposefully devised to utilise 3D wafer stacking for monolithically integrating III-V compound LEDs with Si-CMOS devices on a common silicon-based platform to realize a side-by-side hybrid circuit without need to use through-silicon-vias (TSVs). That is, the multilayer structure (as shown in FIGS. 1B to 1D and 2B to 2D) is a hybrid structure which incorporates Si-CMOS devices and III-V LED devices on a universal, single, silicon platform. Damage to the Si-CMOS devices may be avoided because the III-V materials of the LEDs are grown separately, from the Si-CMOS devices, in desired high temperature environments, without being concerned about damaging the Si-CMOS devices in those high temperatures.

FIGS. 1D and 2D show example embodiments of a multilayer structure for a pixelated display. In these embodiments, the CMOS devices are formed in second layers (e.g., reference numeral 120, 220 in FIG. 1D, 2D respectively), which are disposed above LEDs formed in first layers (106, 206 in FIG. 1D, 2D respectively). The first layers comprise group III-V semiconductor material for forming LEDs (light emitting devices), while the second layers comprise Silicon-based CMOS devices, the CMOS (Complementary Metal Oxide Semiconductor) devices for controlling the LEDs. The first layers are obtained from a first wafer and the second layers are obtained from a second wafer, wherein the first and second wafers bonded together to form a composite wafer via a double-bonding transfer process, such that the first and second layers are now disposed on a same substrate.

In the example embodiments shown in FIGS. 1D and 2D, as the LEDs are formed in first layers below the CMOS devices in the second layers, the LEDs are formed in portions of the first layers, directly underneath portions of the second layers unused by the CMOS devices. That is, the LEDs and CMOS devices do not substantially overlap each other, when viewed from the above the composite wafer. This can allow for the portions of the LEDs to be exposed, such that access to the LEDs are provided, when unused portions of the second layers (unused by the CMOS devices) are removed. As shown in FIGS. 1D and 2D, metal interconnects 150, 250 may thus be formed between the LEDs and CMOS in their respective first and second layers.

FIGS. 3A to 3D illustrate a method of forming a multilayer structure for a pixelated display, in another example embodiment. In this example embodiment, unprocessed semiconductor light emitting devices (i.e. device layers) are transferred on top of the CMOS control circuitry/devices via a double-bonding-transfer process.

In other words, the light emitting devices are fabricated only after the first wafer is bonded with the second wafer. Prior to bonding with the second wafer, the first wafer comprises layers suitable for forming semiconductor light emitting devices in the form of e.g., diodes or laser diodes which are grown on Si (or other substrates). As for bonding, the first wafer is vertically integrated to CMOS control circuitry on a Si wafer via a double-bonding-transfer process.

Figure 3A:
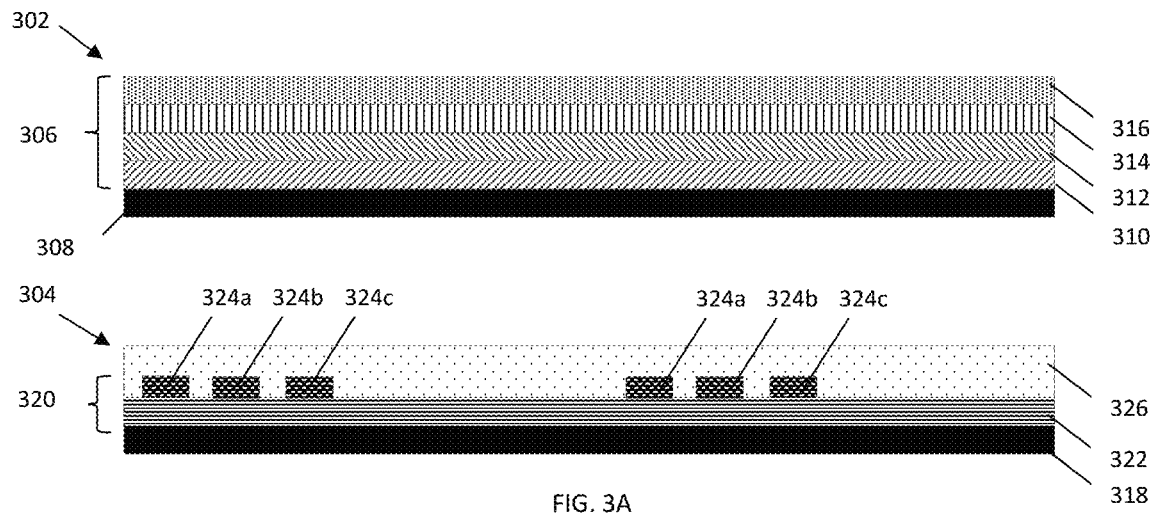
FIGS. 3A to 3E illustrate a method of forming a multilayer structure for a pixelated display, in another example embodiment.

FIG. 3A shows a first wafer 302 and a second wafer 304, in an example embodiment. The first wafer 302 comprises unprocessed layers 306 for forming light emitting devices disposed over a first substrate 308. The layers 306 comprises a buffer layer 310 disposed over the substrate layer 308, an n-type semiconductor layer 312 disposed over the buffer layer 310, an active region layer 314 disposed over the n-type semiconductor layer 312, and a p-type semiconductor layer 316 disposed over the active region layer 314. It will be appreciated that a dielectric oxide layer (not shown) is disposed over the p-type semiconductor 316 layer.

In the example embodiment, the first layers 306 comprises group III-V semiconductor material, which may include (for example): GaN, InGaP, AlGaAs, InGaAsP, InGaN, AlGaN, GaAs, InGaAs, or any suitable combinations thereof, or the like. Thus, the first wafer 302 may also be termed as a III-V/Si (e.g. InGaAs/GaAs/Si or GaN/Si) wafer. Both the InGaAs/GaAs/Ge/Si and GaN/Si wafers may be grown epitaxially using Metalorganic Chemical Vapour Deposition (MOCVD) or Molecular Beam Epitaxy (MBE). It will be appreciated that the first layers 306 may comprise other semiconductor material groups such as group II-VI and group IV semiconductor materials which may include e.g., BAlN, BGaN, BInN, BInGaN, AlN, ZnO or MgZnO.

The second wafer 304 is a partially processed wafer where CMOS (Complementary Metal Oxide Semiconductor) devices have been formed in second layers 320 disposed over a second substrate 318. The second layers comprise the CMOS device layer 322 as well as the source, gate and drain contacts 324a, 324b and 324c of each transistor of the CMOS device.

In the example embodiment, the second wafer 304 comprises (and arranged in the following top-down orientation): a layer of dielectric material 326, second layers 320 comprising CMOS devices formed therein, and a substrate layer of e.g., silicon material 318. The layer of dielectric material of the second wafer 304, is deposited on the second layers 320 using Plasma-Enhanced Chemical Vapour Deposition (PECVD). For simplicity sake, the layer of dielectric material is hereinafter referred to as the PECVD SiO2 layer 326. It will be appreciated that after the PECVD process, the surface roughness may be relatively high and thus, Chemical Mechanical Planarization (CMP) may be further required after the PECVD process to achieve the desired surface roughness of e.g., less than 1 nm, to facilitate fusion bonding. In this regard, the PECVD SiO2 layer 326 deposited on the second layers 320 may serve as a capping layer for planarization process, as well as providing a bonding interface subsequently. Additional densification is carried out (at a suitable temperature between 300° C. to 850° C.) to eliminate any residual gas molecules and by-products incorporated into the PECVD SiO2 layer 326 during the oxide deposition. In this case, the densification process is done at 450° C. for several hours in a nitrogen environment. After densification, the PECVD SiO2 layer 326 is planarized using CMP process.

The first wafer 302 and the second wafer 304 are bonded together via a double-bonding transfer process. Under this double-bonding transfer process, a handle wafer (not shown) is first bonded to the first wafer 302 (e.g. using a wafer bonder) to enable removal of the layer of the first substrate 308. Specifically, the handle wafer is bonded to a surface of the first wafer 302 that is opposite the first substrate 308 (e.g., on or proximate the first layers 306). The handle substrate may be formed of silicon, but does not preclude other suitable materials from being used. The first wafer 302 (now bonded with the handle wafer) may be annealed to increase and enhance the bonding strength between the handle wafer and the first layers 306.

Next, the first substrate 308 is removed from the first wafer 302. Particularly, the first substrate 308 is at least partially removed using mechanical grinding, and then followed by depositing (e.g. spin coating) a layer of protective material (e.g. ProTEK®B3-25, silicon dioxide or silicon nitride). Subsequently, the first wafer (bonded with the handle wafer) is wet- or dry-etched to substantially remove any remaining portions of the first substrate 308 (that are not removed by the mechanical grinding). A buffer layer 310 is provided between the first substrate 308 and first layers 306.

A variety of materials may be used for the buffer layer 310, depending on the type/material of the device and wafer. For a given type of device (e.g. GaN LED) there may be two possibilities for the buffer layers, depending on the type of wafer 302 is used. For example, a) For a GaN LED on Si wafer, the buffer layer will be solely composed of semiconductor material (e.g., III-N alloys);

b) For a GaN LED on insulator (GaN-OI) wafer, the buffer layer will include at least one dielectric layer (hence the "on-insulator" description), and possibly one or more semiconductor layers (i.e. III-N alloys).

The buffer layer 310 may also serve as an etch stop layer during the e.g., wet-etching process. In such a scenario, the buffer layer 310 may comprise e.g., a dielectric etch stop layer (DESL). This DESL in buffer layer 310 may then also serve as the covering oxide layer for bonding of the wafers. This DESL may also be replaced with a new covering oxide layer using e.g., PECVD, spin-on glass, PETEOS etc., if necessary.

In order to facilitate bonding of the wafers, and where the buffer layer 310 does not comprise a DESL, a new covering oxide layer using PECVD, spin-on glass, PETEOS etc., may be deposited, after the substrate 308 and an unrequired portion of buffer 310 is removed via time-etching.

With removal of the layer of first substrate 308, the first wafer is considered as being temporarily transferred to the handle wafer. After etching, the protective material is removed from the handle wafer using oxygen plasma. Alternatively, the coating of protective material is removable using an appropriate solvent, such as acetone, methyl isoamyl ketone (MIAK) or methyl ethyl ketone (MEK).

Subsequently, the first wafer is ready to be bonded to the second wafer. To prepare for this second bonding step, the first wafer 302 and the second wafer 304 are first positioned relative to each other such that the surface of the second wafer opposite the second substrate 318 (e.g., oxide layer over the CMOS device layer 322), face the surface of the first wafer, where the first substrate 308 has been removed (e.g., buffer layer 310).

In this embodiment, for illustration purpose, the first wafer 302 is positioned above the second wafer 304, and so, it will be appreciated that the first and second wafers 302, 304 are arranged diametrically to each other in this position. To generalise, all that is required for the bonding is to bring the oxide layer 326 of the second wafer 302 and the buffer layer 310 of the first wafer 304 together, such that their covering oxide layers are in contact and then bonding them (e.g. using, fusion bonding or thermal compression bonding, which can be further strengthened optionally with annealing).

Without loss of generality, a combined wafer 330 (FIG. 3B) is formed from this bonding of the first and second wafers 302, 304. The bonding may be viewed as bonding the first wafer 302 on top of the first wafer 304, wherein a surface of the first wafer 302 where the first substrate 308 has been removed, is bonded to a surface of the second wafer 302, opposite the second substrate 318. In this bonding process, the respective bonded surfaces of the first wafer 302 and the second wafer 304 contain oxide layers, which serves as a bonding medium/agent 328 as now shown in FIG. 3B.

Next, the handle wafer is removed from the combined wafer 330 to expose at least a portion (e.g. an entire surface) of the p-type semiconductor layer 316 of the first layers 306, which may be further processed for intended applications. In particular, the handle wafer is removed using mechanical grinding and then wet etched to substantially remove any remaining portions of the handle wafer, not removable by the mechanical grinding.

Figure 3B:
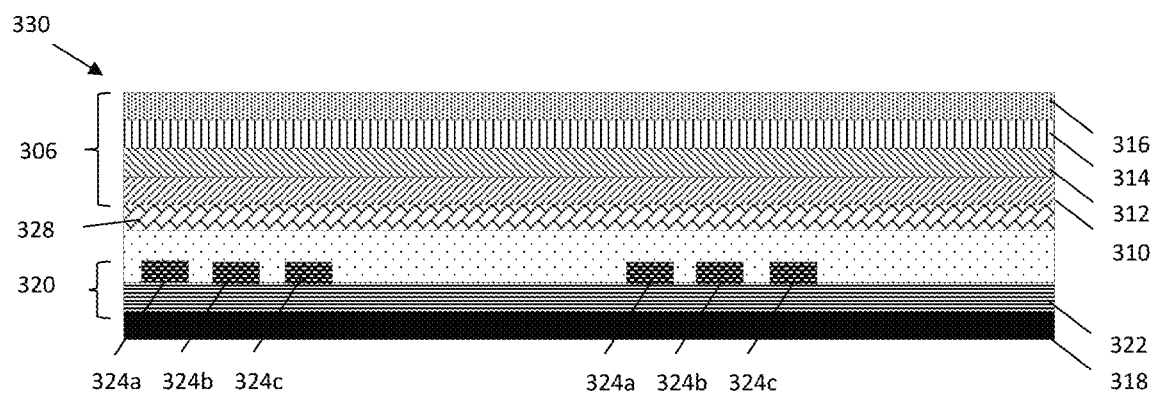

FIG. 3B shows the combined wafer 330, comprising the bonded first wafer and second wafer, where the first substrate 308 has been removed, in the example embodiment. The bonding medium agent 328 rests between the interface of the bond between the first and second wafers, between the first layers 306 and the CMOS device layers and its covering dielectric layer 326.

Detailed information on the techniques of the double-bonding transfer process have been described in U.S. Pat. No. 9,530,763B2, and PCT Publication No. WO 2016/007088, and which are hereby incorporated by reference in their entirety.

Figure 3C:
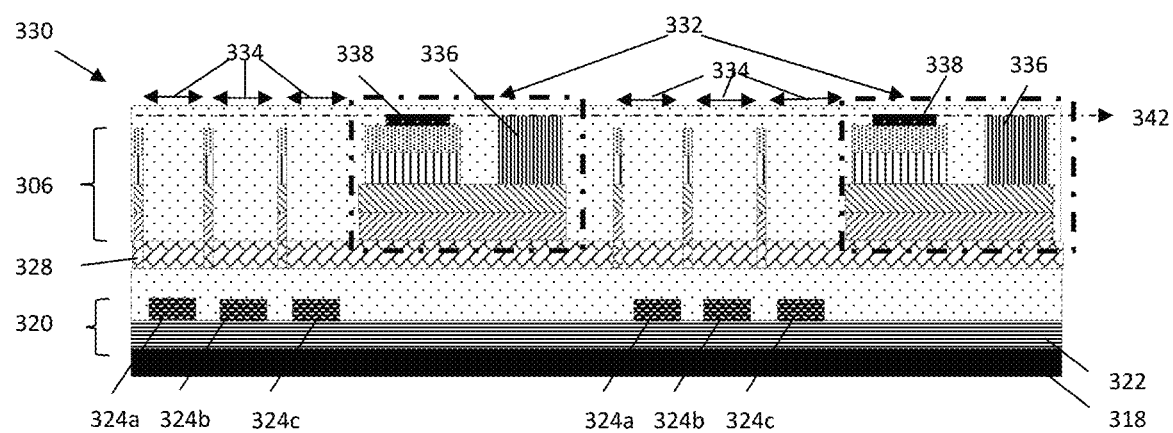

After the combined wafer has been formed, the fabrication of the light emitting devices within the first layers 306 of the first wafer can commence. FIG. 3C shows the combined wafer 330, comprising the bonded first wafer and second wafer, where fabrication of the light emitting devices 332 has been completed, in the example embodiment.

The fabrication of the LEDs 332 is as follows. The LEDs may be formed from the first layers using a combination of lithography techniques such as mesa etching, n-contact formation, p-contact formation $SiO_2$ deposition and planarization steps, which are known to a skilled person and are thus not described in detail herein for brevity. The n-contacts 336 and p-contacts 338 of the LEDs 332 are fabricated respectively, wherein the surface of both n-contacts 336 and p-contacts 338 are of approximately the same height (relative to the buffer layer), such that the n-contacts 336 and p-contacts 338 are accessible from above the first wafer 302 at substantially the same level 342, said level relative to the substrate 318.

In the example embodiment, as the CMOS devices are buried beneath the first (LED) layers 306, the LEDs have to be fabricated at locations where they do not directly overlap with or are directly over the contacts of the CMOS devices, such that the CMOS devices (or at least their contacts) are exposed when unused portions of the first layers are removed. As shown in FIG. 3C, the respective source, gate and drain contacts 324a, 324b and 324c of each transistor of the CMOS devices in the CMOS device layer 320, are accessible from above the LEDs, via the access windows 334 where the LEDs 338 are not fabricated.

Figure 3D:
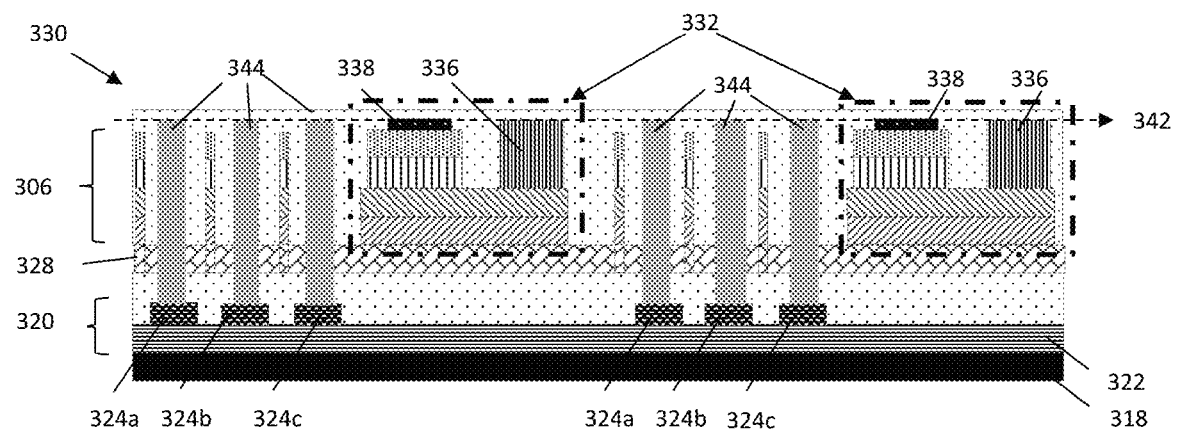

Thereafter, as illustrated in FIG. 3D tungsten (W) vias or plugs 344 formed on the contacts 324a, 324b and 324c of the CMOS device through etching of the above (LED) layers and the bonding medium 328, W deposition, and W chemical mechanical polishing (CMP) such that the CMOS contacts are extended to be accessible from above the wafer 330 at substantially the same level 342 as the n-contacts 336 and p-contacts 338, said level 342 relative to the substrate 318. The combined or integrated wafer 330 is then deposited with a dielectric 348, e.g., $SiO_2$ and planarized.

Finally, multilayer metallization processes, which may include, but not limited to, standard or existing CMOS back-end-of-line (BEOL) processes, are used to electrically connect the CMOS devices and light emitting devices to form the desired circuitry, a schematic example of which is shown in FIG. 5. For example, the BEOL process may further include the steps of:

1. Making holes in the pre-metal dielectric layer (e.g., dielectric layer 348) and extending the contacts of the CMOS device (e.g., 324a, 324b, 324c) and LED (e.g., previously already extended by the tungsten plug 344);
2. Adding a first metal layer;
3. Adding an intra-metal dielectric layer;
4. Making further vias through the intra-metal dielectric to connect the first metal layer metal with the subsequent higher metal layer, with the vias filled by metal CVD processes.

It will be appreciated that where applicable or required, further metal layers may be added by repeating steps 2 to 4.

Figure 3E:
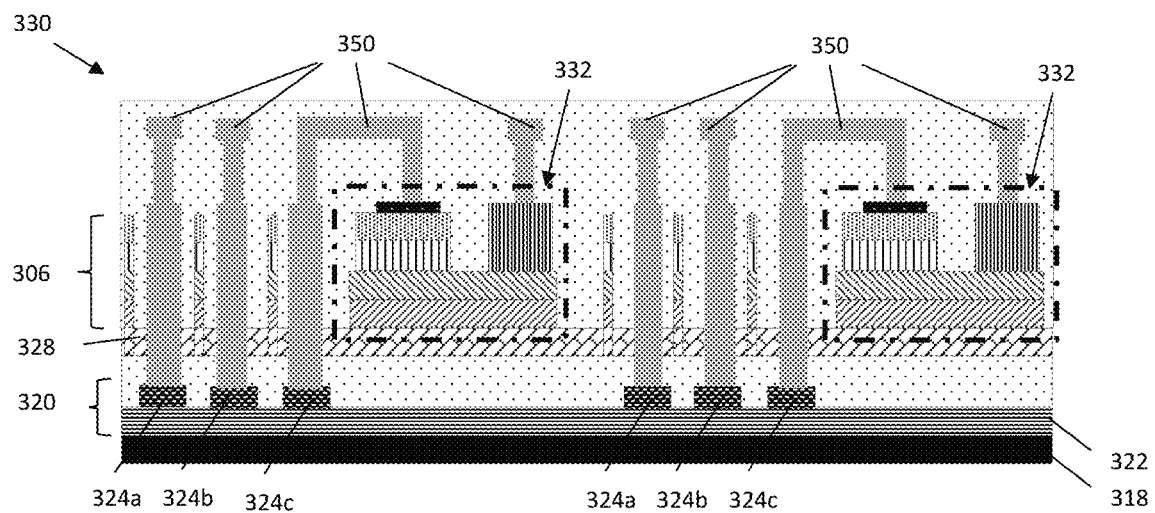

FIG. 3E shows the combined wafer 330, comprising the bonded first wafer and second wafer, where fabrication of the light emitting devices 332 has been completed, and metal (e.g., tungsten) interconnects 350 between the CMOS devices and light emitting devices 332 have been formed, in the example embodiment.

It will be appreciated that while the example embodiment shown in FIG. 3 shows a "p-up" device structure where the p-type semiconductor layer 316 is disposed above the n-type semiconductor layer 312, the orientation of the layers 312 and 316 may be reversed while still allowing the formation of light emitting devices. In other words, in an alternative embodiment, the layer 316 may be a n-type semiconductor layer, and the layer 312 may be a p-type semiconductor layer to form a "p-down" device structure. In this alternative embodiment, the contact 336 becomes the p-contact, while the contact 338 becomes the n-contact. It will be appreciated that both "p-up" and "p-down" structures are known/typical orientations for p-n junction devices.

FIGS. 4A to 4D illustrate a method of forming a multilayer structure for a pixelated display, in another example embodiment. In this example embodiment, processed or pre-fabricated semiconductor light emitting devices (i.e. device layers) are transferred on top of the CMOS control circuitry/devices via an aligned double-bonding-transfer process.

In other words, the light emitting devices have been fabricated prior to bonding with the second wafer. The first wafer comprises fabricated light emitting devices in the form of e.g., diodes or laser diodes which are grown on Si (or other substrates). As for bonding, because the light emitting devices have been fabricated, the bonding of the first and second wafers is aligned to ensure that the fabricated LEDs do not substantially overlap the vertically integrated CMOS control circuitry, such that the contacts of the CMOS control circuitry are accessible from above the first wafer, in order for metal interconnects (in the form of e.g., tungsten vias or plugs made through etching of the unused LED layers and the bonding medium) between the LEDs and CMOS devices to be formed.

Figure 4A:
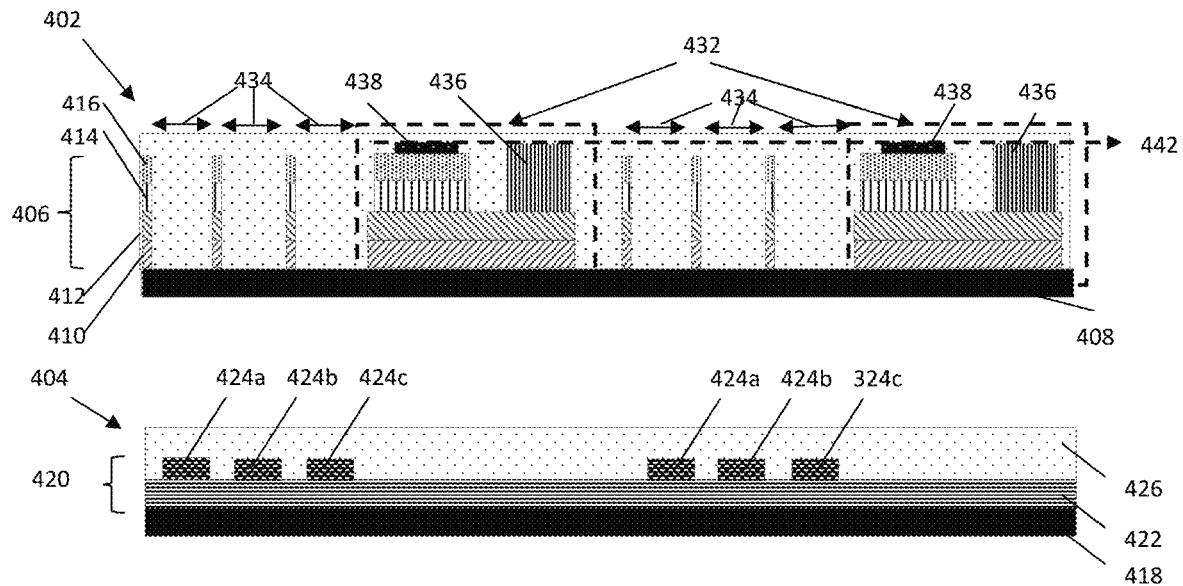
FIGS. 4A to 4D illustrate a method of forming a multilayer structure for a pixelated display, in another example embodiment.

FIG. 4A shows a first wafer 402 and a second wafer 404, in an example embodiment. The first wafer 402 comprises partially processed layers 406 where light emitting devices 432 have been pre-fabricated and are disposed over a first substrate 408. The layers 406 comprises a buffer layer 410 disposed over the substrate layer 408, an n-type semiconductor layer 412 disposed over the buffer layer 410, an active region layer 414 disposed over the n-type semiconductor layer 412, and a p-type semiconductor layer 416 disposed over the active region layer 414. It will be appreciated that a dielectric oxide layer (not shown) is disposed over the p-type semiconductor 416 layer.

In the example embodiment, the first layers 406 comprises group III-V semiconductor material, which may include (for example): GaN, InGaP, AlGaAs, InGaAsP, InGaN, AlGaN, GaAs, InGaAs, or any suitable combinations thereof, or the like. Thus, the first wafer 402 may also be termed as a III-V/Si (e.g. InGaAs/GaAs/Si or GaN/Si) wafer. Both the InGaAs/GaAs/Ge/Si and GaN/Si wafers may be grown epitaxially using Metalorganic Chemical Vapour Deposition (MOCVD) or Molecular Beam Epitaxy (MBE). It will be appreciated that the first layers 406 may comprise other semiconductor material groups such as group II-VI and group IV semiconductor materials which may include e.g., BAlN, BGaN, BInN, BInGaN, AlN, ZnO or MgZnO.

During fabrication, the LEDs 432 are formed using a combination of lithography techniques such as mesa etching, n-contact formation, p-contact formation SiO$_2$ deposition and planarization steps, which are known to a skilled person and are thus not described in detail herein for brevity. Preferably, the n-contacts 436 and p-contacts 438 of the LEDs 432 are fabricated respectively, wherein the surface of both n-contacts 436 and p-contacts 438 are of approximately the same height, such that the n-contacts 436 and p-contacts 438 are accessible from above the first wafer 402, at substantially the same level 442, said level 442 relative to the substrate 408. It will be appreciated that a dielectric oxide layer is disposed over the first wafer 402, and CMP carried out to substantially planarize the surface, to complete the fabrication of the LEDs 432 on the first wafer 402. In addition to the fabrication of the LEDs 432, the first wafer 402 may also comprise via holes or access windows 434 which provide access to the CMOS contact pads of the second wafer. These via holes may be created during the mesa etching step or in a separate step, and may involve partial or complete removal of the light emitting device material in the regions which will be directly above the CMOS devices after bonding to form the composite wafer.

The second wafer 404 is a partially processed wafer where CMOS (Complementary Metal Oxide Semiconductor) devices have been formed in second layers 420 disposed over a second substrate 418. The second layers comprises the CMOS device layer 422 as well as the source, gate and drain contacts 424a, 424b and 424c of each transistor of the CMOS device.

In the example embodiment, the second wafer 404 comprises (and arranged in the following top-down orientation): a layer of dielectric material 426, second layers 420 comprising CMOS devices formed therein, and a substrate layer of e.g., silicon material 418. The layer of dielectric material of the second wafer 404, is deposited on the second layers 420 using Plasma-Enhanced Chemical Vapour Deposition (PECVD). For simplicity sake, the layer of dielectric material is hereinafter referred to as the PECVD SiO2 layer 426.

It will be appreciated that after the PECVD process, the surface roughness may be relatively high and thus, Chemical Mechanical Planarization (CMP) may be further required after the PECVD process to achieve the desired surface roughness of e.g., less than 1 nm, to facilitate fusion bonding. In this regard, the PECVD SiO2 layer 426 may be deposited on the second layers 420 to serve as a capping layer for planarization process, as well as providing a bonding interface subsequently. Additional densification is carried out (at a suitable temperature between 400° C. to 850° C.) to eliminate any residual gas molecules and by-products incorporated into the PECVD SiO2 layer 426 during the oxide deposition. In this case, the densification process is done at 450° C. for several hours in a nitrogen environment. After densification, the PECVD SiO2 layer 426 is planarized using Chemical Mechanical Planarization (CMP) process.

The first wafer 402 and the second wafer 404 are bonded together via a double-bonding transfer process. Under this double-bonding transfer process, a handle wafer (not shown) is first bonded to the first wafer 402 (e.g. using a wafer bonder) to enable removal of the layer of the first substrate 408. Specifically, the handle wafer is bonded to a surface of the first wafer 402 that is opposite the first substrate 418 (e.g., on or proximate the first layers 406). The handle substrate may be formed of silicon, but does not preclude other suitable materials from being used. The first wafer 402 (now bonded with the handle wafer) may be annealed to increase and enhance the bonding strength between the handle wafer and the first layers 406.

Next, the first substrate 408 is removed from the first wafer 402. Particularly, the first substrate 408 is at least partially removed using mechanical grinding, and then followed by depositing (e.g. spin coating) a layer of protective material (e.g. ProTEK®B3-25, silicon dioxide or silicon nitride). Subsequently, the first wafer (bonded with the handle wafer) is wet- or dry-etched to substantially remove any remaining portions of the first substrate 408 (that are not removed by the mechanical grinding).

A buffer layer 410 is provided between the first substrate 408 and first layers 406. A variety of materials may be used for the buffer layer 410, depending on the type/material of the device and wafer. For a given type of device (e.g. GaN LED) there may be two possibilities for the buffer layers, depending on the type of wafer 402 is used. For example, a) For a GaN LED on Si wafer, the buffer layer will be solely composed of semiconductor material (e.g., III-N alloys); b) For a GaN LED on insulator (GaN-OI) wafer, the buffer layer will include at least one dielectric layer (hence the "on-insulator" description), and possibly one or more semiconductor layers (i.e. III-N alloys).

The buffer layer 410 may also serve as an etch stop layer during the e.g., wet-etching process. In such a scenario, the buffer layer 410 may comprise e.g., a dielectric etch stop layer (DESL). This DESL in buffer layer 410 may then also serve as the covering oxide layer for bonding of the wafers. This DESL may also be replaced with a new covering oxide layer using e.g., PECVD, spin-on glass, PETEOS etc., if necessary.

In order to facilitate bonding of the wafers, and where the buffer layer 410 does not comprise a DESL, a new covering oxide layer using PECVD, spin-on glass, PETEOS etc., may be deposited, after the substrate 408 and an unrequired portion of buffer 410 is removed via time-etching.

With removal of the layer of first substrate 408, the first wafer is considered as being temporarily transferred to the handle wafer. After etching, the protective material is removed from the handle wafer using oxygen plasma. Alternatively, the coating of protective material is removable using an appropriate solvent, such as acetone, methyl isoamyl ketone (MIAK) or methyl ethyl ketone (MEK).

Subsequently, the first wafer is ready to be bonded to the second wafer. To prepare for this second bonding step, the first wafer 402 and the second wafer 404 are first positioned relative to each other such that the surface of the second wafer opposite the second substrate 418 (e.g., oxide layer over the CMOS device layer 422), face the surface of the first wafer, where the first substrate 408 has been removed (e.g., buffer layer 410).

In this embodiment, for illustration purpose, the first wafer 402 is positioned above the second wafer 404, and so, it will be appreciated that the first and second wafers 402, 404 are arranged diametrically to each other in this position. To generalise, all that is required for the bonding is to bring the oxide layer 426 of the second wafer 402 and the buffer layer 410 of the first wafer 404 together, such that their respective covering oxide layers are in contact and then bonding them (e.g. using, fusion bonding or thermal compression bonding, which can be further strengthened optionally with annealing).

Without loss of generality, a combined wafer 430 (FIG. 4B) is formed from this bonding of the first and second wafers 402, 404. The bonding may be viewed as bonding the first wafer 402 on top of the first wafer 404, wherein a surface of the first wafer 402 where the first substrate 408 has been removed, is bonded to a surface of the second wafer 402, opposite the second substrate 418. In this bonding process, the respective bonded surfaces of the first wafer 402 and the second wafer 404 contain oxide layers, which serves as a bonding medium/agent 428 as now shown in FIG. 4B.

In this example embodiment, the LEDs 432 and CMOS devices have been fabricated prior to the bonding process. Thus, an alignment of the LEDs 432 and CMOS devices will have to be performed, during the bonding process. That is, the first wafer 402 is bonded on top of the second wafer 402, wherein a side of the first wafer where the first substrate 408 has been removed is bonded to a side of the second wafer opposite the second substrate, in a manner where the LEDs 432 do not directly overlap with or are directly over the contacts of the CMOS devices, such that the contacts of the CMOS devices are exposed when unused portions of the first layers 206 (unused by the LEDs 432) are removed. As shown, FIG. 4B, access windows 434 from which access from above the LEDs 432 to the respective source, gate and drain contacts 424a, 424b and 424c of each transistor of the CMOS device comprised in the CMOS device layer, is provided. As mentioned above, the access windows 434 are formed when portions of the first layers 206, unused by the LEDs 432, are removed.

Next, the handle wafer is removed from the combined wafer 430 to expose the dielectric layer covering the n-contacts 436 and p-contacts 438, which may be further processed for intended applications. In particular, the handle wafer is removed using mechanical grinding and then wet etched to substantially remove any remaining portions of the handle wafer, not removable by the mechanical grinding.

Figure 4B:
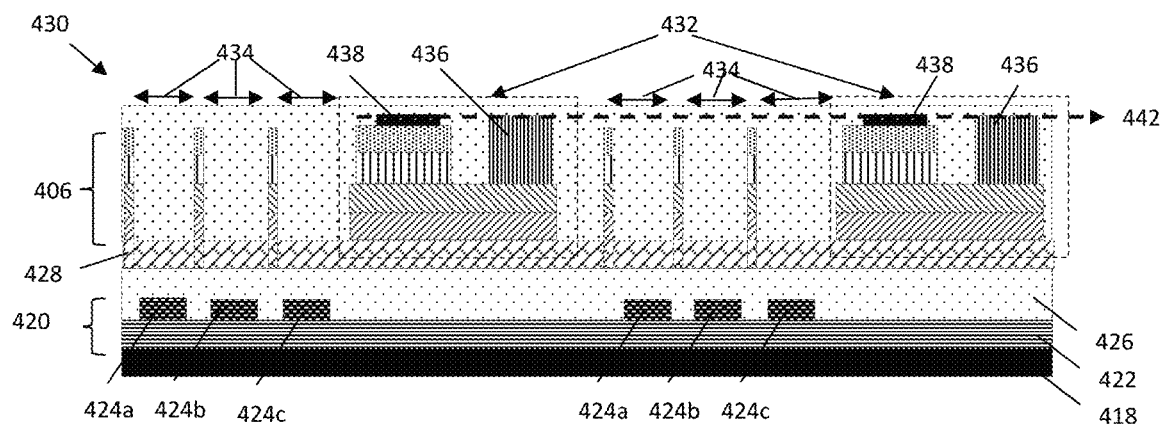

FIG. 4B shows the combined wafer 430, comprising the bonded first wafer and second wafer, where the first substrate 408 has been removed, in the example embodiment. The bonding medium agent 428 rests between the interface of the bond between the first and second wafers, between the first layers 406 and the CMOS device layers and its covering dielectric layer 426.

Detailed information on the techniques of the double-bonding transfer process have been described in U.S. Pat. No. 9,530,763B2, and PCT Publication No. WO 2016/007088, and which are hereby incorporated by reference in their entirety.

Figure 4C:
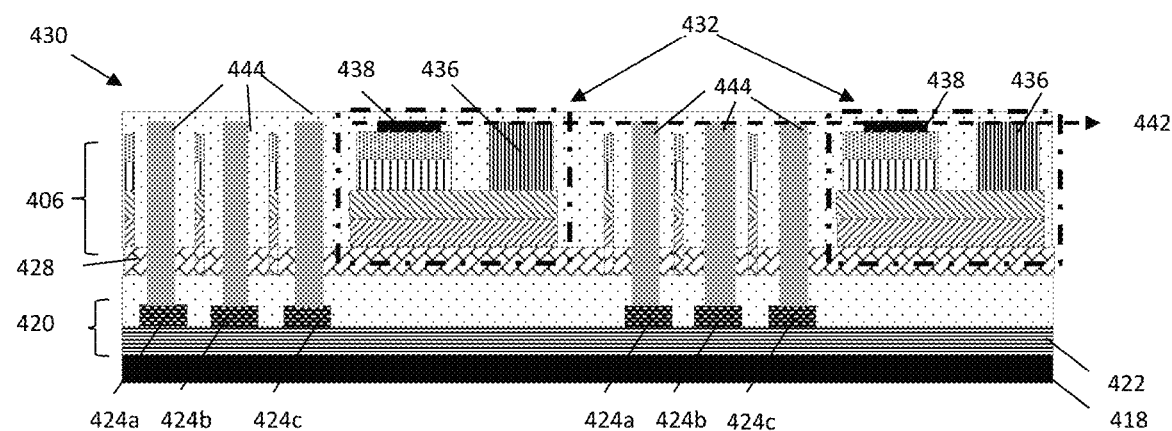

Thereafter, as illustrated in FIG. 4C tungsten (W) vias or plugs 444 formed on the contacts 424a, 424b and 424c of the CMOS device through etching of the above (LED) layers and the bonding medium 428, W deposition, and W chemical mechanical polishing (CMP) such that the CMOS contacts are extended to be accessible from above the composite wafer 430 at substantially the same level 442 as the n-contacts 436 and p-contacts 438, said level 442 relative to the substrate 418. The combined or integrated wafer 430 is then deposited with a dielectric 448, e.g., $SiO_2$ and planarized.

Finally, multilayer metallization processes, which may include, but not limited to, standard or existing CMOS back-end-of-line processes, are used to electrically connect the CMOS devices and light emitting devices to form the desired circuitry, a schematic example of which is shown in FIG. 5. For example, the BEOL process may further include the steps of:

1. Making holes in the pre-metal dielectric layer (e.g., dielectric layer 448) and extending the contacts of the CMOS device (e.g., 424a, 424b, 424c) and LED (e.g., previously already extended by the tungsten plug 444);
2. Adding a first metal layer;
3. Adding an intra-metal dielectric layer;
4. Making further vias through the intra-metal dielectric to connect the first metal layer metal with the subsequent higher metal layer, with the vias filled by metal CVD processes.

It will be appreciated that where applicable or required, further metal layers may be added by repeating steps 2 to 4.

Figure 4D:
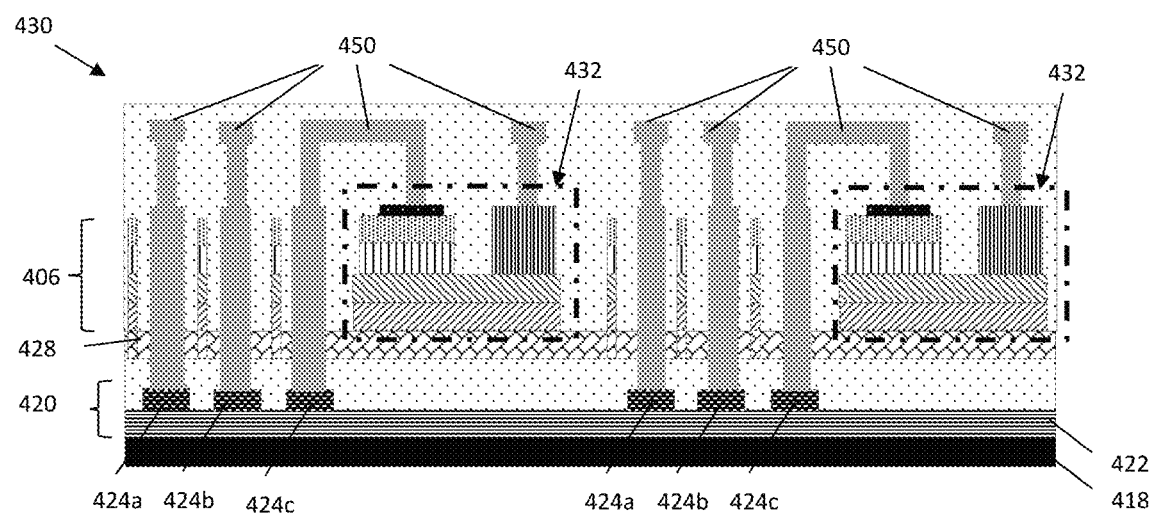

FIG. 4D shows the combined wafer 430, comprising the bonded first wafer and second wafer, metal (e.g., tungsten) interconnects 450 between the CMOS devices and light emitting devices 432 have been formed, in the example embodiment.

It will be appreciated that while the example embodiment shown in FIG. 4 shows a "p-up" device structure where the p-type semiconductor layer 416 is disposed above the n-type semiconductor layer 412, the orientation of the layers 412 and 416 may be reversed while still allowing the formation of light emitting devices. In other words, in an alternative embodiment, the layer 416 may be a n-type semiconductor layer, and the layer 412 may be a p-type semiconductor layer to form a "p-down" device structure. In this alternative embodiment, the contact 436 becomes the p-contact, while the contact 438 becomes the n-contact. It will be appreciated that both "p-up" and "p-down" structures are known/typical orientations for p-n junction devices.

FIGS. 3E and 4D show example embodiments of a multilayer structure for a pixelated display. In these embodiments, the LEDs formed in first layers (306, 406 in FIG. 3E, 4D respectively) are disposed over CMOS devices formed in second layers (e.g., reference numeral 320, 420 in FIG. 3E, 4D respectively). The first layers comprise group III-V semiconductor material for forming LEDs (light emitting devices), while the second layers comprise Silicon-based CMOS devices, the CMOS (Complementary Metal Oxide Semiconductor) devices for controlling the LEDs. The first layers are obtained from a first wafer and the second layers are obtained from a second wafer, wherein the first and second wafers bonded together to form a composite wafer via a double-bonding transfer process, such that the first and second layers are now disposed on a same substrate.

In the example embodiments shown in FIGS. 3E and 4D, as the CMOS devices are formed in second layers below the LEDs in the first layers, the CMOS devices are formed in portions of the second layers, directly underneath portions of the first layers unused by the LEDs. That is, the LEDs and CMOS devices do not overlap each other, when viewed from the above the composite wafer. This can allow for the CMOS devices to be exposed, such that access to the CMOS are provided, when unused portions of the first layers (unused by the LEDs) are removed. As shown in FIGS. 3E and 4E, metal interconnects 350, 450 may thus be formed between the LEDs and CMOS in their respective first and second layers.

A high density active array of LEDs (or lasers) with CMOS control circuits can be achieved using the fabrication method defined in any one of the above-mentioned embodiments.

It will be appreciated that the various layers as described and shown in the example embodiments, may be patterned based on the application of the device, and may thus be different from that as illustrated in the drawings. For example, in FIG. 1C, the n-layer 112 is not patterned (i.e. it is continuous across the entire wafer), while in FIG. 2B, the n-layer 212 is patterned. This is because depending on the application (i.e. how one chooses to operate the various LED elements), one can "isolate" one LED from another in a variety of ways:

a) Etching through the active region but leaving the n-layer untouched (see e.g., layer 112 in FIG. 1C)
b) Etching into the n-layer partially
c) Etching the n-layer fully but leaving the buffer layer untouched (see e.g., layer 212 in FIG. 2B)
d) Etching into one or more of the constituent buffer layers (partially/fully) (see e.g., layer 310 in FIG. 3C).

The choice may affect how the LED is electrically connected to the rest of the circuit elements, and may also have implications of fabrication process robustness/yield, and thus depending on the circuit design and process optimization, different options could be selected.

FIG. 5 shows a schematic diagram of a unit cell 500 comprising a single LED 502 and a driver unit 504, in an example embodiment. In the example embodiment, the LED 502 is III-V semiconductor based, while the driver unit is Si CMOS based.

As shown in FIG. 5, the driver unit 504 comprises a driving FET (field effect transistor) 506, a switching FET 508 and a storage capacitor 510. In the exemplary embodiment, the driving FET is a p-channel FET, where its source is electrically connected to a power supply Vdd 512 and the drain is electrically connected to an input end of the LED 502. The switching FET 508 is a p-channel FET, where the gate and drain of the switching FET are respectively electrically connected to addressing signals, Vdata 514 and Vselect 516. The source of the switching FET 508 is electrically connected to the gate of the driving FET 506, and the storage capacitor 510 is electrically connected between the gate of the driving FET and an output end of the LED 502. In operation, when the addressing signals Vdata 514 and Vselect 516 are activated, the driving FET 506 is switched on such that power supply is provided to the LED 502.

Figure 6A:
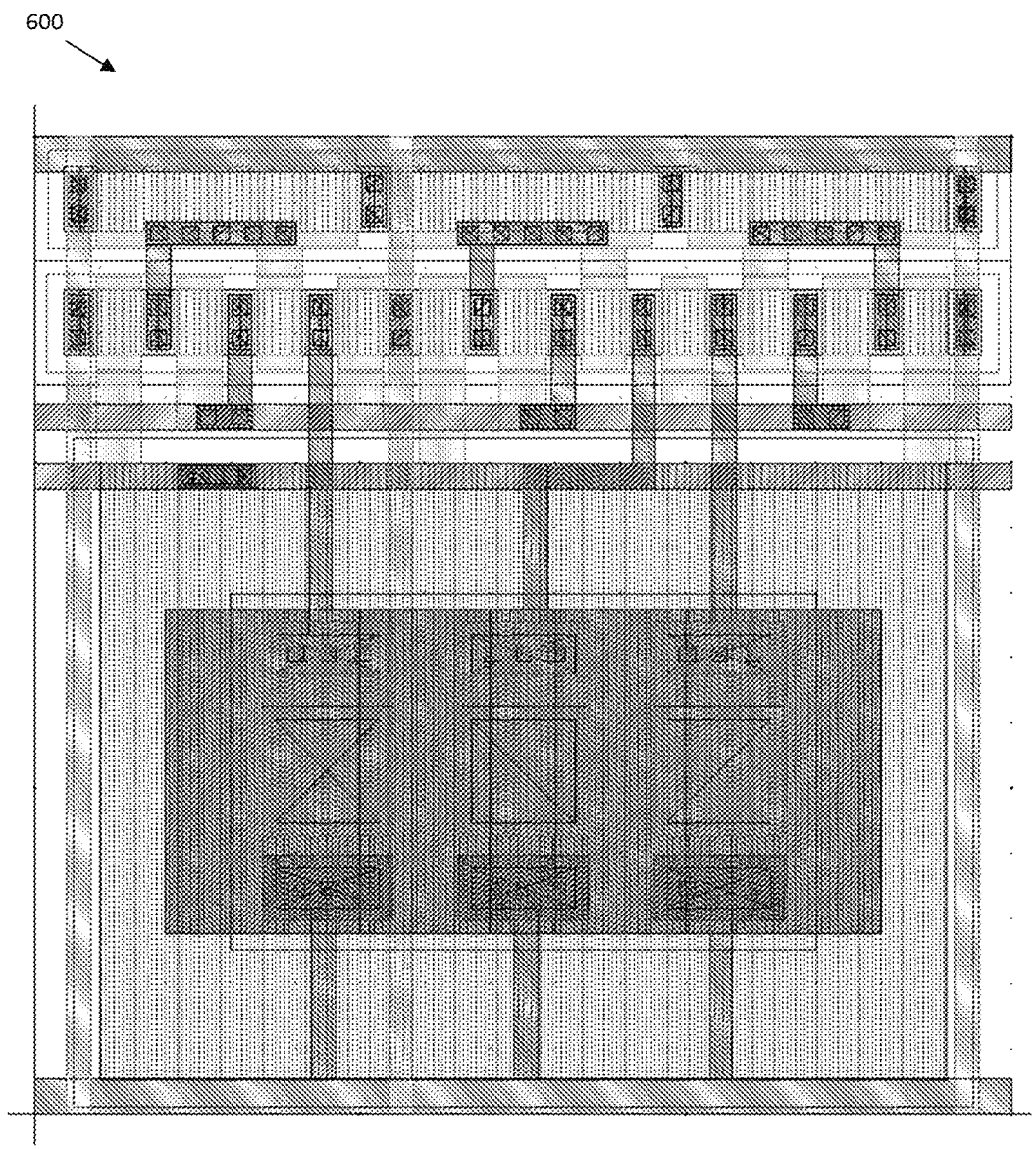
FIG. 6A is a mask layout for a full colour pixel, in an example embodiment.
Figure 6B:
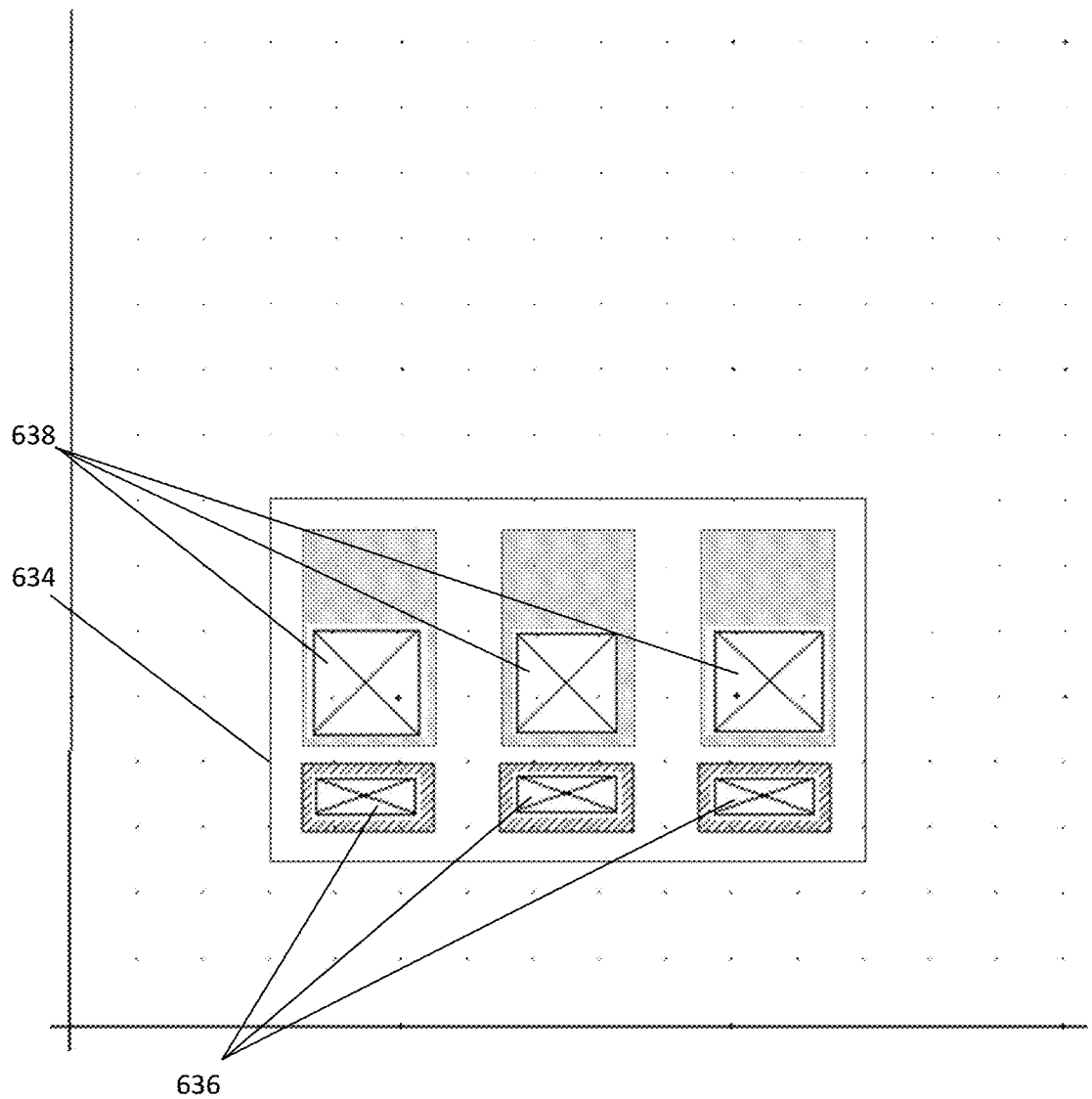
FIGS. 6B to 6F are mask layout views showing individual components of the example embodiment.
Figure 6C:
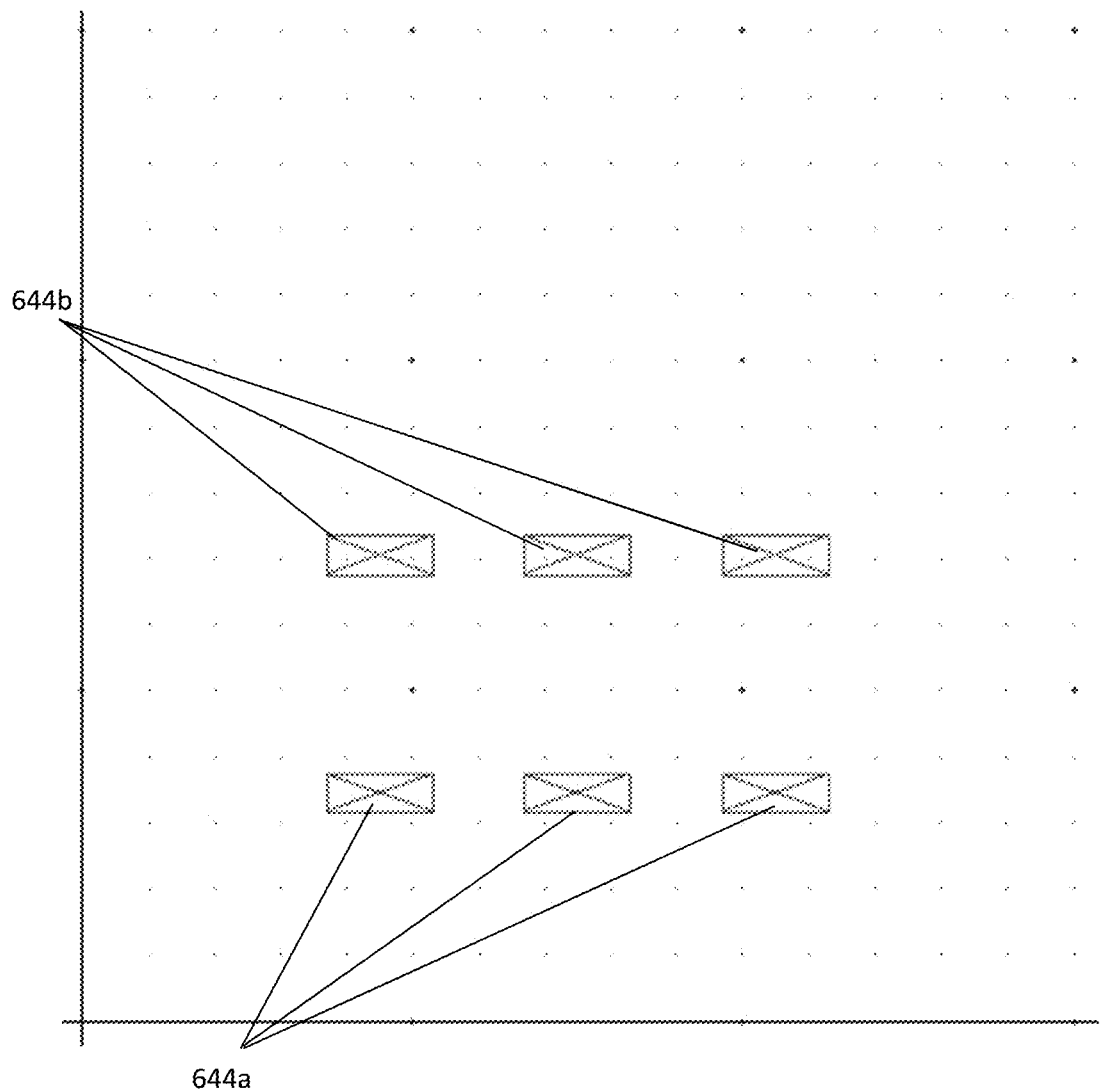
Figure 6D:
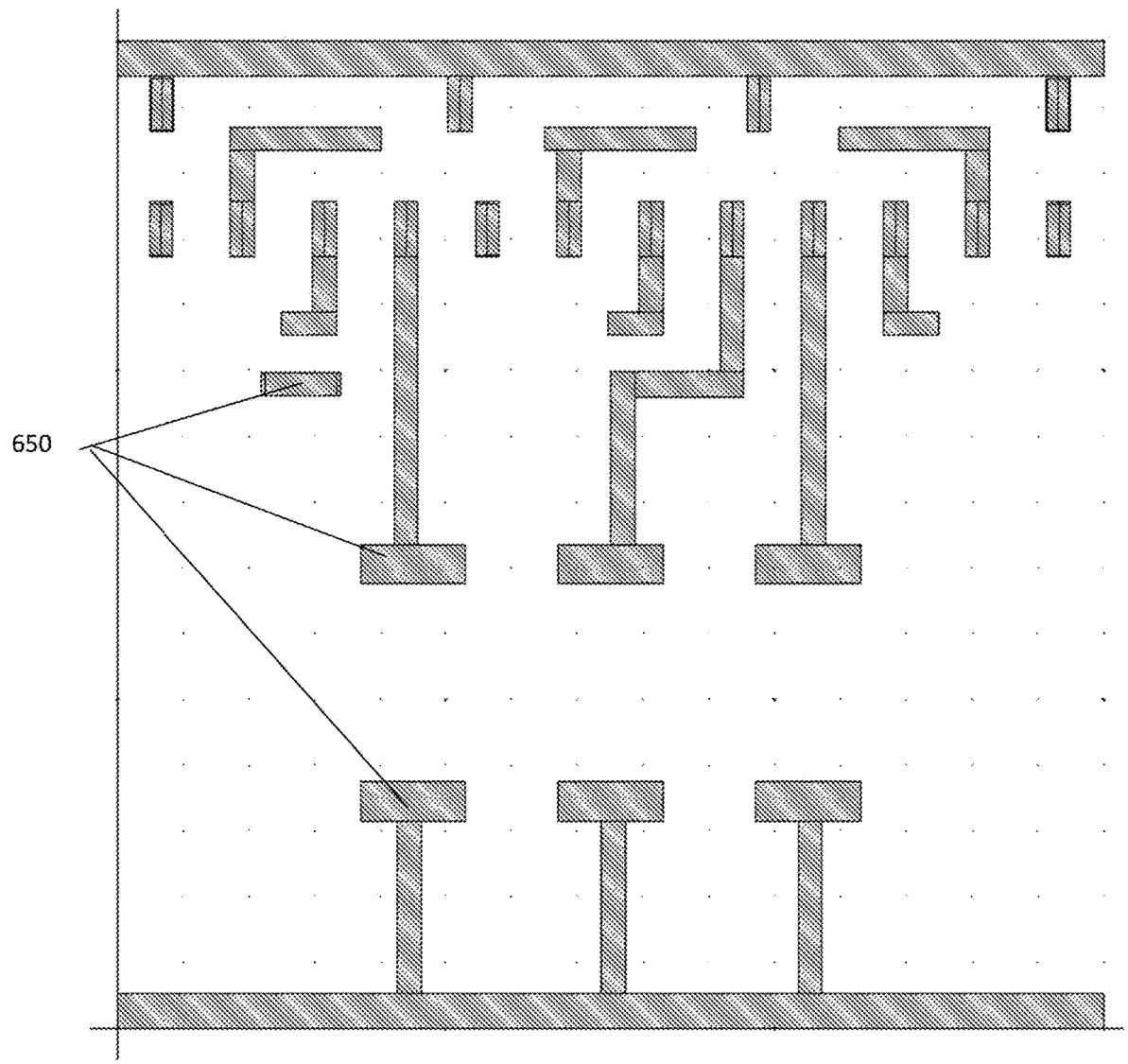
Figure 6E:
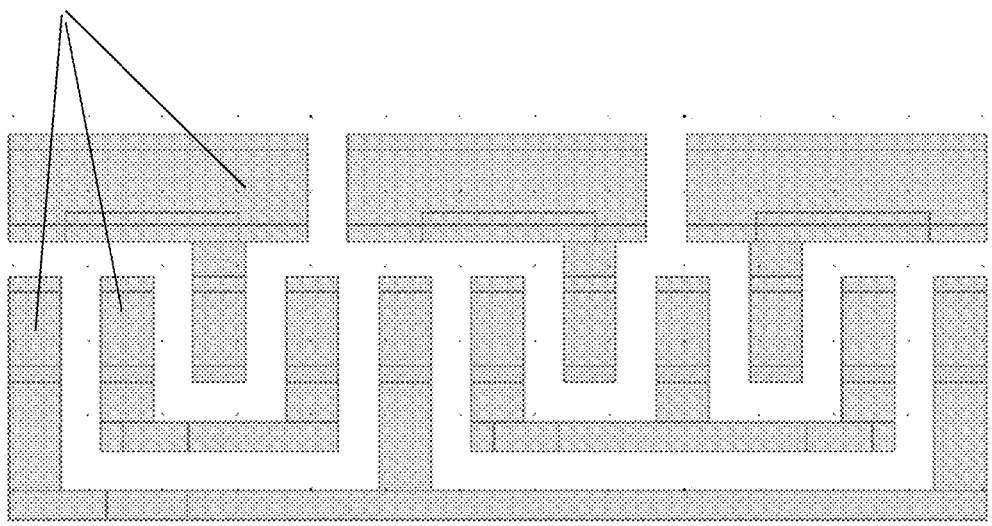
Figure 6F:
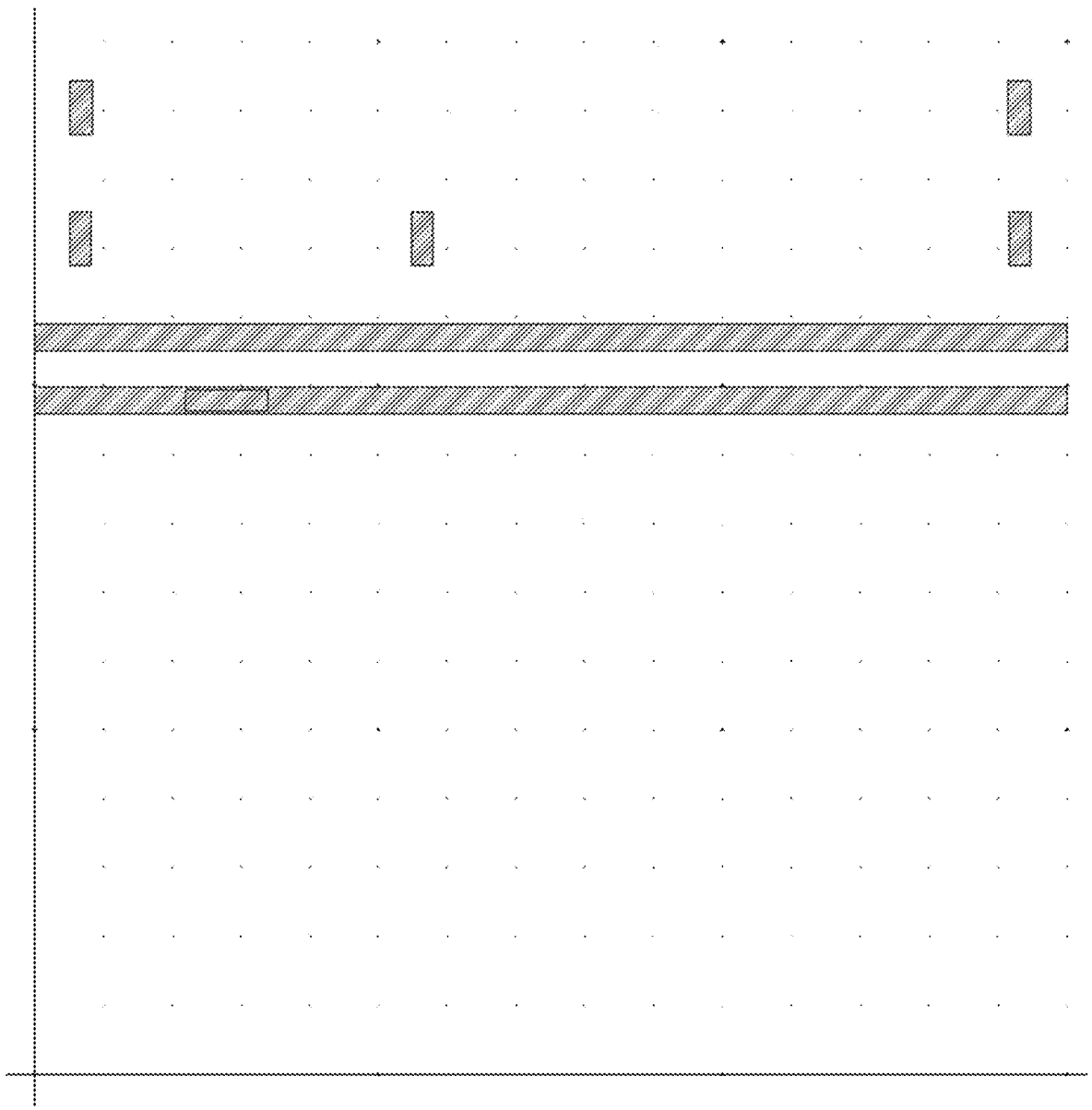

It will be appreciated that a full colour red, green and blue (RGB) pixel consists of three sets of LEDs with their individual drivers. FIG. 6A shows a mask layout for a full colour pixel, in an example embodiment. Individual components of the layout 600 are shown in FIGS. 6B to 6F for better clarity. FIG. 6B is a layout view showing the opened window 634 (corresponding with e.g., window 134 of FIGS. 1C and 1D), as well as the n-contacts 636 (corresponding with n-contact 136 of FIGS. 1C and 1D) and p-contacts 638 (corresponding with p-contact 138 of FIGS. 1C and 1D) of three LEDs. FIG. 6C is a layout view showing the tungsten plugs 644 (corresponding with plugs 144 of FIGS. 1C and 1D. 6D, 6E and 6F are respective layout views showing the connections between the contacts of the CMOS device and the LED device. FIG. 6D is a layout view showing the CMOS first metal layer 650 (corresponding with numeral 150 in FIG. 1D). FIG. 6E is a layout view showing the CMOS polygate 624b (corresponding with numeral 124b in FIG. 1A). FIG. 6F is a layout showing the CMOS second metal layer (not shown in FIG. 1).

Figure 7:
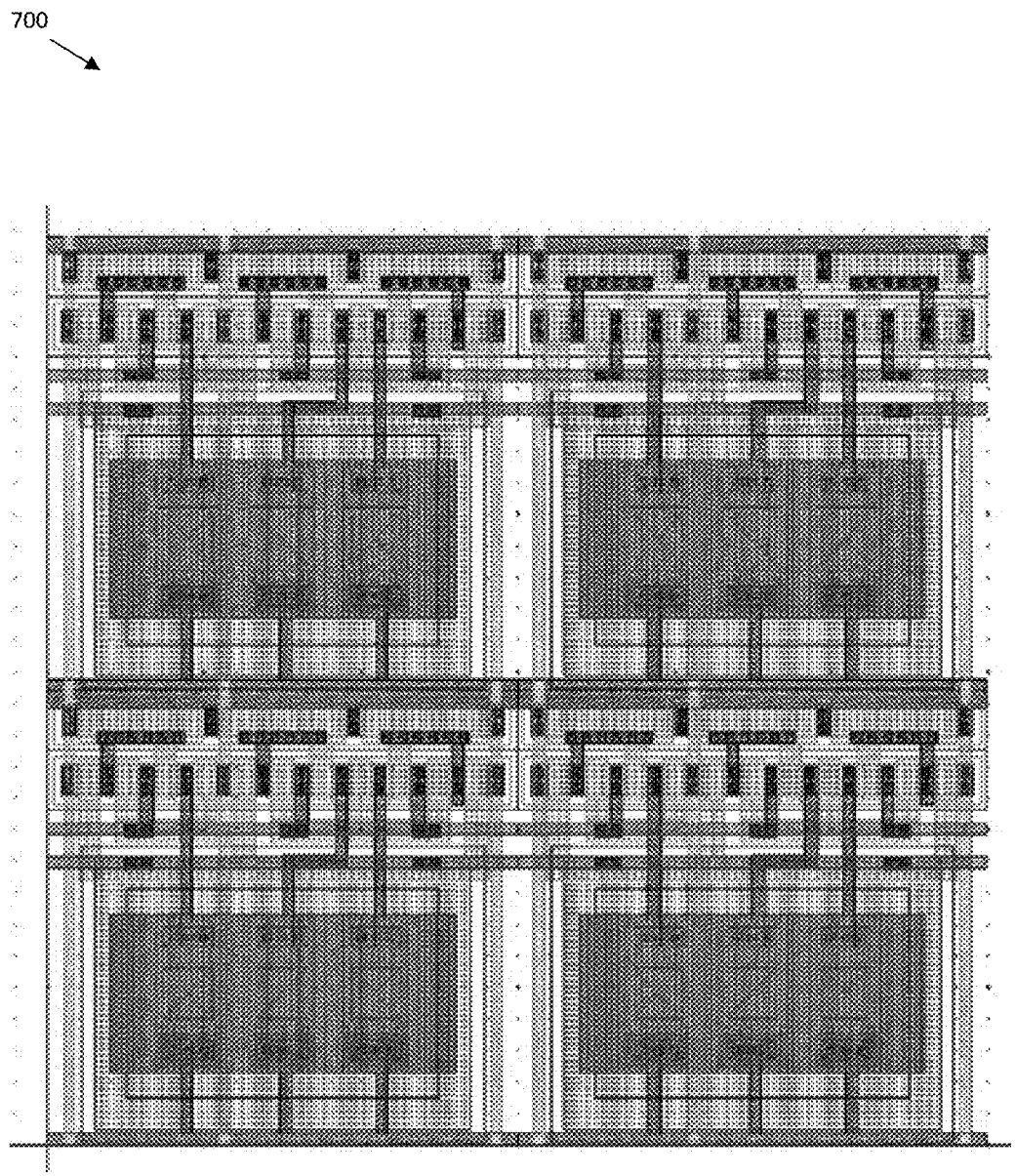
FIG. 7 is a mask layout for a 2×2 colour pixel array, in an example embodiment.

For such a layout, assuming the methods as described above in FIG. 1 to FIG. 4 are implemented with lithography tools with a resolution of 250 nm, a pixel pitch of 15 μm or less can be readily achieved. FIG. 7 shows a mask layout for a 2×2 colour pixel array, in an example embodiment. It will be appreciated that this 2×2 array comprises four of the pixels shown in FIG. 6A.

In the above mentioned embodiments illustrated in FIGS. 6 and 7, individual LEDs of 2 μm or less are depicted. This translates to a pixels per inch (PPI) value of about 1700. Furthermore, PPI can be further increased by employing lithography tools with finer resolution, and/or with CMOS and III-V processes with smaller critical dimensions.

Moreover, the CMOS control circuits (or CMOS devices) can be placed directly below the light emitting devices in the third and the fourth embodiments (FIGS. 3 and 4), unlike the first and the second embodiment. This could potentially increase PPI and effective aperture (ratio of the light emitting area to total surface area) of the display. It will be appreciated that the contacts of the CMOS circuits should remain accessible from above the LEDs. That is, the LEDs are positioned such that they do not overlap with the Source-Gate-Drain contacts of the CMOS device.

Figure 8:
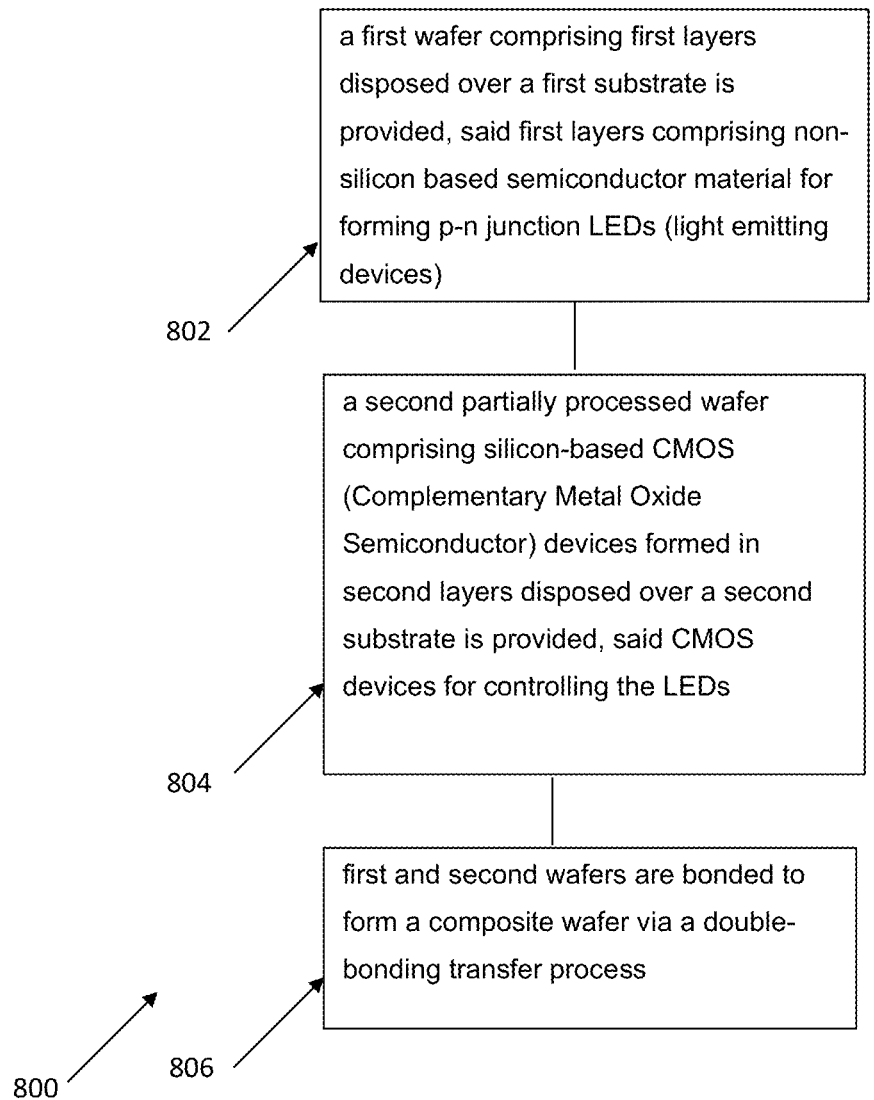
FIG. 8 shows a method for forming a multilayer structure for a pixelated display, in an example embodiment.

FIG. 8 shows a method 800 for forming a multilayer structure for a pixelated display, in an example embodiment. At step 802, a first wafer comprising first layers disposed over a first substrate is provided. The first layers comprises group III-V semiconductor material for forming LEDs (light emitting devices). At step 804, a second partially processed wafer comprising silicon-based CMOS (Complementary Metal Oxide Semiconductor) devices formed in second layers disposed over a second substrate is provided. The CMOS devices for controlling the LEDs. At step 806, first and second wafers are bonded to form a composite wafer via a double-bonding transfer process.

In example embodiments, the combination of solid state LED and Si-based CMOS has unique advantages over LCD/thin film transistors (TFT)/LED backlight and organic LED (OLED)/TFT types of displays.

Firstly, since the device characteristics of the solid state LEDs and Si CMOS drivers are inherently uniform on a wafer scale, sophisticated circuit designs (that consume more CMOS circuit area) that are dedicated to address the non-uniformity issues in such hybrid semiconductor devices can be avoided, allowing for a smaller unit cell and higher array resolution.

Additionally, the CMOS switching transistor has low current leakage, which prevents discharging of the storage capacitor. This gives the CMOS-integrated solid state LED an advantage in power efficiency.

Thirdly, the 3 dB modulation bandwidth of solid state LEDs is in the range of 100 MHz to 1 GHz whereas LCDs and OLEDs are limited to several kHz. Thus, display applications or control methodologies that prioritize fast refresh rates are not limited by the modulation bandwidth of the display component.

Moreover, solid state LEDs demonstrate a high luminance of several $10^6$ cd/m$^2$ which is two orders of magnitude higher than OLEDs. This can advantageously allow for self-emissive projection systems possible with the example embodiments of the present application.

Additionally, exemplary process or architecture of the present application allows standard CMOS backend processes to be used to connect not just CMOS devices (i.e. conventional technology), but both CMOS devices and other e.g., III-V semiconductor devices. This is particularly advantageous as CMOS backend interconnection technology is well developed, widely-used, and has the highest density interconnection technology available for the formation of integrated circuits.

Further, because the p-n junction (e.g., III-V) semiconductors are grown separately from the Si CMOS devices, the Si CMOS devices can be prevented from exposures to the high temperatures which are necessary for high quality III-V material growth.

The term "substrate" as used herein is to be interpreted broadly to refer to a structure to which one or more materials, or one or more layers of material may be deposited thereon. The substrate may comprise one or more layers of material deposited thereon. The substrate may comprise a wafer comprising one or more layers of material such as, but not limited to, e.g. dielectric layers, metal layers, etc. deposited thereon.

The term "layer" when used to describe a structure is to be interpreted broadly to refer to a level or thickness of the structure that is distinguishable from another level or thickness of another structure. The structure is distinguishable from the other structure and may comprise same or different materials. The structure and the other structure may be same or different, as long as they are distinguishable from each other. A layer is not limited to a single material but may comprise one or more sub-layers or intermediate layers of one or more materials, which may themselves also be distinguishable from adjacent layers. Accordingly, when the layer is formed by individual sub-layers or intermediate layers, the dimensions of each of individual sub-layer or intermediate layer may be same or different.

The terms "coupled" or "connected" as used in this description are intended to cover both directly connected or connected through one or more intermediate means, unless otherwise stated.

The term "associated with", used herein when referring to two elements refers to a broad relationship between the two elements. The relationship includes, but is not limited to a physical, a chemical or an electrical relationship. For example, when element A is associated with element B, elements A and B may be directly or indirectly attached to each other or element A may contain element B or vice versa.

The term "adjacent" used herein when referring to two elements refers to one element being in close proximity to another element and may be but is not limited to the elements contacting each other or may further include the elements being separated by one or more further elements disposed therebetween.

The terms "above", "below", "beneath", "under", "over", "top", "bottom" and the like as used herein refers to a position in relation to the substrate of the wafer or multilayer structure being described. For example, with reference to FIG. 1A, the p-type semiconductor layer 116 is disposed "over" or "above" the active region area 114, relative to the substrate 108 as the base, while the buffer layer 110 is "under", "beneath" or "below" the n-type semiconductor layer 112, relative to the substrate 108 as the base. For the first layers 106, the "top" layer refers to the p-type semiconductor layer 116, while the "bottom" layer refers to the buffer layer 110, relative to the substrate 108 as the base. Access of a particular level from "above" the wafer refers to allowing the particular level to be accessible from beyond the "top" of the wafer, opposite the substrate.

The term "and/or", e.g., "X and/or Y" is understood to mean either "X and Y" or "X or Y" and should be taken to provide explicit support for both meanings or for either meaning.

Further, in the description herein, the word "substantially" whenever used is understood to include, but not restricted to, "entirely" or "completely" and the like. In addition, terms such as "comprising", "comprise", and the like whenever used, are intended to be non-restricting descriptive language in that they broadly include elements/components recited after such terms, in addition to other components not explicitly recited. Further, terms such as "about", "approximately" and the like whenever used, typically means a reasonable variation, for example a variation of +/−5% of the disclosed value, or a variance of 4% of the disclosed value, or a variance of 3% of the disclosed value, a variance of 2% of the disclosed value or a variance of 1% of the disclosed value.

Furthermore, in the description herein, certain values may be disclosed in a range. The values showing the end points of a range are intended to illustrate a preferred range. Whenever a range has been described, it is intended that the range covers and teaches all possible sub-ranges as well as individual numerical values within that range. That is, the end points of a range should not be interpreted as inflexible limitations. For example, a description of a range of 1% to 5% is intended to have specifically disclosed sub-ranges 1% to 2%, 1% to 3%, 1% to 4%, 2% to 3% etc., as well as individually, values within that range such as 1%, 2%, 3%, 4% and 5%. The intention of the above specific disclosure is applicable to any depth/breadth of a range.

Additionally, when describing some embodiments, the disclosure may have disclosed a method and/or process as a particular sequence of steps. However, unless otherwise required, it will be appreciated that the method or process should not be limited to the particular sequence of steps disclosed. Other sequences of steps may be possible. The particular order of the steps disclosed herein should not be construed as undue limitations. Unless otherwise required, a method and/or process disclosed herein should not be limited to the steps being carried out in the order written. The sequence of steps may be varied and still remain within the scope of the disclosure.

Example embodiments of the disclosure will be better understood and readily apparent to one of ordinary skill in the art from the following discussions and if applicable, in conjunction with the Figures. It should be appreciated that other modifications related to structural, electrical and optical changes may be made without deviating from the scope of the invention. Example embodiments are not necessarily mutually exclusive as some may be combined with one or more embodiments to form new exemplary embodiments.

It will be appreciated by a person skilled in the art that other variations and/or modifications may be made to the specific embodiments without departing from the scope of the invention as broadly described. The present embodiments are, therefore, to be considered in all respects to be illustrative and not restrictive.

The invention claimed is:

1. A method of forming a multilayer structure for a pixelated display, the method comprising
providing a first wafer comprising first layers disposed over a first substrate, said first layers comprising non-silicon based semiconductor material;
providing a second partially processed wafer comprising silicon-based CMOS (Complementary Metal Oxide Semiconductor) devices formed in second layers disposed over a second substrate;
bonding a handle wafer to the second wafer, on a surface of the second wafer that is opposite the second substrate;
removing the second substrate from the second wafer;
bonding the second wafer on top of the first wafer, wherein a surface of the second wafer where the second substrate has been removed, is bonded to a surface of the first wafer, opposite the first substrate;
removing portions of the second layers unused by the CMOS devices, to form windows such that the first layers are exposed; and
fabricating p-n junction LEDs (Light Emitting Devices) in the first layers after the windows are formed, wherein fabricating the LEDs comprises fabricating n-contacts and p-contacts of the same height, such that the n-contacts and p-contacts are accessible at substantially the same level.

2. The method as claimed in claim 1, wherein the CMOS devices comprises electrical contacts, the method further comprising forming tungsten plugs on the n-contacts and p-contacts, such that the tungsten plugs extend the n-contacts and p-contacts to be at the same level as the contacts of the CMOS devices.

3. The method as claimed in claim 2, further comprising depositing a dielectric layer on the composite wafer on a surface opposite the first substrate;
planarising the dielectric layer such that a top surface of the composite wafer is substantially level; and
connecting the CMOS devices and the LEDs with multilayer metallisation processes.

4. The method as claimed in claim 3, wherein connecting the CMOS devices and the LEDs comprises connecting the CMOS device and the LEDs with CMOS back-end-of-line multilayer metallisation processes.

5. A method of forming a multilayer structure for a pixelated display, the method comprising
providing a first partially processed wafer comprising first layers disposed over a first substrate, said first layers comprising p-n junction LEDs (light emitting devices) formed from non-silicon based semiconductor material, the LEDs comprising n-contacts and p-contacts of the same height, such that the n-contacts and p-contacts are substantially at the same level;
providing a second partially processed wafer comprising silicon-based CMOS (Complementary Metal Oxide Semiconductor) devices formed in second layers disposed over a second substrate;
bonding a handle wafer to the second wafer, on a side of the second wafer that is opposite the second substrate;
removing the second substrate from the second wafer;
bonding the second wafer on top of the first wafer, wherein a side of the second wafer where the second substrate has been removed is bonded to a side of the first wafer opposite the first substrate, in a manner where the LEDs and CMOS devices do not substantially overlap each other, such that portions of the LEDs are exposed when unused portions of the second layers are removed.

6. The method as claimed in claim 5, wherein the CMOS devices comprises electrical contacts, the method further comprising forming tungsten plugs on the n-contacts and p-contacts, such that the tungsten plugs extend the n-contacts and p-contacts to be at the same level as the contacts of the CMOS devices.

7. The method as claimed in claim 6, further comprising depositing a dielectric layer on the composite wafer on a surface opposite the first substrate;
planarising the dielectric layer such that a top surface of the composite wafer is substantially level; and
connecting the CMOS devices and the LEDs with multilayer metallisation processes.

8. The method as claimed in claim 7, wherein connecting the CMOS devices and the LEDs comprises connecting the CMOS device and the LEDs with CMOS back-end-of-line multilayer metallisation processes.

9. A method of forming a multilayer structure for a pixelated display, the method comprising
providing a first wafer comprising first layers disposed over a first substrate, said first layers comprising non-silicon based semiconductor material;
providing a second partially processed wafer comprising silicon-based CMOS (Complementary Metal Oxide Semiconductor) devices formed in second layers disposed over a second substrate;
bonding a handle wafer to the first wafer, on a side of the first wafer that is opposite the first substrate;
removing the first substrate from the first wafer;
bonding the first wafer on top of the second wafer, wherein a side of the first wafer where the first substrate has been removed is bonded to a side of the second wafer opposite the second substrate; and
fabricating p-n junction Light Emitting Devices (LEDs) in the first layers, in a manner where the LEDs and CMOS devices do not substantially overlap each other, such that contacts of the CMOS devices are exposed when unused portions of the first layers are removed.

10. The method as claimed in claim 9, wherein fabricating the LEDs comprises fabricating n-contacts and p-contacts of the same height, such that the n-contacts and p-contacts are substantially at the same level.

11. The method as claimed in claim 10, wherein the CMOS devices comprises electrical contacts, the method further comprising forming tungsten plugs on the contacts of the CMOS devices, such that the tungsten plugs extend the contacts of the CMOS devices to be at the same level as the n-contacts and p-contacts.

12. The method as claimed in claim 11, further comprising
depositing a dielectric layer on the composite wafer on a surface opposite the second substrate;
planarising the dielectric layer such that a top surface of the composite wafer is substantially level; and
connecting the CMOS devices and the LEDs with multilayer metallisation processes.

13. The method as claimed in claim 12, wherein connecting the CMOS devices and the LEDs comprises connecting the CMOS device and the LEDs with CMOS back-end-of-line multilayer metallisation processes.

14. A method of forming a multilayer structure for a pixelated display, the method comprising
providing a first partially processed wafer comprising first layers disposed over a first substrate, said first layers comprising p-n junction LEDs (light emitting devices) formed from non-silicon based semiconductor material, the LEDs comprising n-contacts and p-contacts of the same height, such that the n-contacts and p-contacts are substantially at the same level;
providing a second partially processed wafer comprising silicon-based CMOS (Complementary Metal Oxide Semiconductor) devices formed in second layers disposed over a second substrate;
bonding a handle wafer to the first wafer, on a side of the first wafer that is opposite the first substrate;
removing the first substrate from the first wafer; and
bonding the first wafer on top of the second wafer, wherein a side of the first wafer where the first substrate has been removed is bonded to a side of the second wafer opposite the second substrate, in a manner where the LEDs and CMOS devices do not substantially overlap each other, such that contacts of the CMOS devices are exposed when unused portions of the first layers are removed.

15. The method as claimed in claim 14, wherein the CMOS devices comprises electrical contacts, the method further comprising forming tungsten plugs on the contacts of the CMOS devices, such that the tungsten plugs extend the contacts of the CMOS devices to be at the same level as the n-contacts and p-contacts.

16. The method as claimed in claim 15, further comprising
depositing a dielectric layer on the composite wafer on a surface opposite the second substrate;
planarising the dielectric layer such that a top surface of the composite wafer is substantially level; and
connecting the CMOS devices and the LEDs with multilayer metallisation processes.

17. The method as claimed in claim 16, wherein connecting the CMOS devices and the LEDs comprises connecting the CMOS device and the LEDs with CMOS back-end-of-line multilayer metallisation processes.

18. The method as claimed in claim 1, wherein the first layers comprises group III-V semiconductor material, group II-VI semiconductor material or group IV semiconductor material.

19. A multilayer structure for a pixelated display, the multilayer structure comprising
first layers comprising non-silicon based semiconductor material, the first layers comprising p-n junction LEDs (Light Emitting Devices) formed thereon, the LEDs comprises n-contacts and p-contacts of the same height, such that the n-contacts and p-contacts are accessible at substantially the same level; and
second layers formed under the first layers, the second layers comprising silicon-based CMOS (Complementary Metal Oxide Semiconductor) devices;
wherein LEDs and CMOS devices do not substantially overlap each other, such that contacts of the CMOS devices are exposed when unused portions of the first layers are removed.

20. A multilayer structure for a pixelated display, the multilayer structure comprising
first layers comprising non-silicon based semiconductor material, the first layers comprising p-n junction LEDs (Light Emitting Devices) formed thereon, the LEDs comprises n-contacts and p-contacts of the same height, such that the n-contacts and p-contacts are accessible at substantially the same level; and
second layers formed above the first layers, the second layers comprising silicon-based CMOS (Complementary Metal Oxide Semiconductor) devices;
wherein LEDs and CMOS devices do not substantially overlap each other, such that contacts of the LEDs are exposed when unused portions of the second layers are removed.

21. The method as claimed in claim 5, wherein the first layers comprises group III-V semiconductor material, group II-VI semiconductor material or group IV semiconductor material.

22. The method as claimed in claim 9, wherein the first layers comprises group III-V semiconductor material, group II-VI semiconductor material or group IV semiconductor material.

23. The method as claimed in claim 14, wherein the first layers comprises group III-V semiconductor material, group II-VI semiconductor material or group IV semiconductor material.

* * * * *